US011890700B2

(12) United States Patent
Oh et al.

(10) Patent No.: US 11,890,700 B2
(45) Date of Patent: Feb. 6, 2024

(54) DISPLAY MODULE, METHOD FOR MANUFACTURING DISPLAY MODULE, AND LASER MACHINING METHOD

(71) Applicant: Samsung Display Co., Ltd., Yongin-si (KR)

(72) Inventors: Youngjin Oh, Bucheon-si (KR); Sanghoon Lim, Cheonan-si (KR); Jinhyeong Kim, Asan-si (KR); Kyoungseok Cho, Suwon-si (KR); KuHyun Kang, Suwon-si (KR); Sungjin Jang, Daejeon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/994,699

(22) Filed: Nov. 28, 2022

(65) Prior Publication Data
US 2023/0101169 A1    Mar. 30, 2023

Related U.S. Application Data

(62) Division of application No. 16/743,527, filed on Jan. 15, 2020, now Pat. No. 11,534,867.

(30) Foreign Application Priority Data

Apr. 11, 2019 (KR) ........................ 10-2019-0042588

(51) Int. Cl.
*H10K 50/86* (2023.01)
*H10K 50/844* (2023.01)
(Continued)

(52) U.S. Cl.
CPC .............. *B23K 26/38* (2013.01); *G06F 3/041* (2013.01); *H01L 21/02345* (2013.01);
(Continued)

(58) Field of Classification Search
None
See application file for complete search history.

(56) References Cited

U.S. PATENT DOCUMENTS

| 5,910,261 A | 6/1999 | Mori et al. |
|---|---|---|
| 7,033,915 B2 | 4/2006 | Ryu et al. |
| (Continued) | | |

FOREIGN PATENT DOCUMENTS

| CN | 102489884 A | 6/2012 |
|---|---|---|
| CN | 104471468 A | 3/2015 |
| (Continued) | | |

OTHER PUBLICATIONS

Chichkov, et al., Femtosecond, picosecond and nanosecond laser ablation of solids, Applied Physics A 63, pp. 109-115 (1996).

*Primary Examiner* — Evren Seven
(74) *Attorney, Agent, or Firm* — CANTOR COLBURN LLP

(57) ABSTRACT

A method for manufacturing a display module includes preparing a display module comprising a plurality of layers and forming a through-hole in the display module. The forming the through-hole includes performing a first irradiation process of irradiating a first laser beam along a first boundary defining the through-hole, performing a second irradiation process of irradiating a second laser beam along a second boundary after the first irradiation process, and performing a third irradiation process of irradiating a third laser beam along a third boundary after the second irradiation process. A time interval between the first irradiation process and the second irradiation process may be different from a time interval between the second irradiation process and the third irradiation process.

1 Claim, 23 Drawing Sheets

(51) Int. Cl.
  *H10K 50/80*     (2023.01)
  *B23K 26/38*     (2014.01)
  *G06F 3/041*     (2006.01)
  *H01L 21/02*     (2006.01)
  *H10K 59/40*     (2023.01)
  *H10K 71/00*     (2023.01)

(52) U.S. Cl.
  CPC ............. *H10K 50/86* (2023.02); *H10K 59/40* (2023.02); *H10K 71/00* (2023.02); *G06F 2203/04107* (2013.01); *H10K 50/844* (2023.02); *H10K 50/868* (2023.02)

(56) References Cited

U.S. PATENT DOCUMENTS

| | | | |
|---|---|---|---|
| 9,632,357 B2 | 4/2017 | Park et al. | |
| 9,656,291 B2 | 5/2017 | Lee et al. | |
| 9,997,738 B2 | 6/2018 | Choi et al. | |
| 10,121,842 B2 | 11/2018 | Lee et al. | |
| 10,233,112 B2 | 3/2019 | Hackert et al. | |
| 10,322,468 B2 | 6/2019 | Yoo | |
| 10,499,476 B2* | 12/2019 | Kwon | H05B 45/60 |
| 10,615,369 B2* | 4/2020 | Choi | H10K 59/123 |
| 10,748,973 B2 | 8/2020 | Han et al. | |
| 10,957,836 B2 | 3/2021 | Katsumata et al. | |
| 11,201,307 B2* | 12/2021 | Park | H10K 50/80 |
| 2004/0173942 A1 | 9/2004 | Kobayashi et al. | |
| 2009/0195152 A1 | 8/2009 | Sawano | |
| 2009/0269509 A1 | 10/2009 | Yokoyama et al. | |
| 2013/0039092 A1 | 2/2013 | Cho et al. | |
| 2016/0011633 A1* | 1/2016 | Watanabe | G02F 1/1333 345/184 |
| 2016/0190389 A1* | 6/2016 | Lee | A61B 5/0075 438/28 |
| 2016/0200621 A1 | 7/2016 | N'Gom et al. | |
| 2016/0202515 A1* | 7/2016 | Watanabe | G02F 1/1339 349/190 |
| 2017/0150618 A1* | 5/2017 | Choi | H02J 50/10 |
| 2018/0043469 A1 | 2/2018 | Bea et al. | |
| 2018/0111234 A1 | 4/2018 | Mologni | |
| 2018/0132520 A1 | 5/2018 | Ellison et al. | |
| 2018/0179100 A1 | 6/2018 | Marjanovic et al. | |
| 2019/0288047 A1* | 9/2019 | Jeong | H10K 50/11 |

FOREIGN PATENT DOCUMENTS

| | | |
|---|---|---|
| CN | 106029293 A | 10/2016 |
| CN | 108110030 A | 6/2018 |
| EP | 3315243 A1 | 5/2018 |
| JP | 4833773 B2 | 9/2011 |
| JP | 5122833 B2 | 11/2012 |
| JP | 5953198 B2 | 6/2016 |
| JP | 201856456 A | 4/2018 |
| JP | 201935950 A | 3/2019 |
| KR | 20030096379 A | 12/2003 |
| KR | 101436627 B1 | 9/2014 |
| KR | 101527482 B1 | 6/2015 |
| KR | 1020160049207 A | 5/2016 |
| KR | 1020160080310 A | 7/2016 |
| KR | 101702568 B1 | 2/2017 |
| KR | 1020170059537 A | 5/2017 |

* cited by examiner

DISPLAY MODULE, METHOD FOR MANUFACTURING DISPLAY MODULE, AND LASER MACHINING METHOD

This application is a divisional of U.S. patent application Ser. No. 16/743,527, filed on Jan. 15, 2020, which claims priority to Korean Patent Application No. 10-2019-0042588, filed on Apr. 11, 2019, and all the benefits accruing therefrom under 35 U.S.C. § 119, the content of which in its entirety is herein incorporated by reference.

BACKGROUND

The disclosure herein relates to a display module with improved reliability, a method for manufacturing the display module, and a laser machining method.

A display device may include various electronic components such as a display panel for displaying an image, an input sensing member for sensing an external input, and an electronic module. The electronic components may be electrically connected to each other through signal lines variously arranged. The display panel may include a light emitting element for generating an image. The input sensing member may include sensing electrodes for sensing an external input. The electronic module may include a camera, an infrared sensor, and/or a proximity sensor. The electronic module may be disposed under the display panel.

SUMMARY

The disclosure may provide a display module with improved reliability, a method for manufacturing the display module, and a laser machining method.

In an exemplary embodiment of the inventive concepts, a method for manufacturing a display module includes preparing a display module including a plurality of layers, and forming a through-hole in the display module. The forming of the through-hole includes performing a first irradiation process of irradiating a first laser beam along a first boundary defining the through-hole, performing a second irradiation process of irradiating a second laser beam along a second boundary after the performing of the first irradiation process, and performing a third irradiation process of irradiating a third laser beam along a third boundary after the performing of the second irradiation process. A time interval between the first irradiation process and the second irradiation process is different from a time interval between the second irradiation process and the third irradiation process.

In an exemplary embodiment, a start point of the first irradiation process, a start point of the second irradiation process and a start point of the third irradiation process may be different from each other.

In an exemplary embodiment, the first laser beam may be irradiated to a portion of the first boundary in the first irradiation process, the second laser beam may be irradiated to a portion of the second boundary in the second irradiation process, and the portion of the first boundary may be the same as the portion of the second boundary.

In an exemplary embodiment, a movement direction of the first laser beam in the first irradiation process may be different from a movement direction of the second laser beam in the second irradiation process.

In an exemplary embodiment, the display module may include a base layer, a circuit layer disposed on the base layer, an emission layer disposed on the circuit layer, an encapsulation layer disposed on the emission layer, an input sensing layer disposed on the encapsulation layer, and an anti-reflection layer disposed on the input sensing layer.

In an exemplary embodiment, the second irradiation process and the third irradiation process may irradiate the second laser beam and the third laser beam to the anti-reflection layer, respectively.

In an exemplary embodiment, the performing of the first irradiation process may include forming a first concave portion of a sidewall portion of the base layer defining the through-hole, and the performing of the second irradiation process may include forming a second concave portion of the sidewall portion.

In an exemplary embodiment, the first concave portion may be spaced apart from the second concave portion.

In an exemplary embodiment, the time interval between the first irradiation process and the second irradiation process may be 0 second or more, and the time interval between the second irradiation process and the third irradiation process may be greater than the time interval between the first irradiation process and the second irradiation process.

In an exemplary embodiment, the second laser beam and the third laser beam may be irradiated to a layer, having a lowest thermal deformation temperature, of the plurality of layers in the second irradiation process and the third irradiation process, respectively.

In an exemplary embodiment, the first irradiation process may be performed a plurality of times, and a first time interval between an x-th one and an (x+1)-th one of the first irradiation processes may be 0 second or more. Here, x is a natural number.

In an exemplary embodiment, the second irradiation process may be performed a plurality of times, and a second time interval between a y-th one and a (y+1)-th one of the second irradiation processes may be greater than 0 second. Here, y is a natural number In an exemplary embodiment, the first time interval may be provided every m irradiation processes of the first laser beam in the first irradiation processes, the second time interval may be provided every n irradiation processes of the second laser beam in the second irradiation processes, and 'm' may be greater than 'n'. Here, m and n are a natural number In an exemplary embodiment, the second time interval may be provided immediately after each of the second irradiation processes.

In an exemplary embodiment, the first boundary, the second boundary and the third boundary may be the same as each other.

In an exemplary embodiment, the third boundary may be surrounded by the second boundary in a plan view.

In an exemplary embodiment, power of the second laser beam may be lower than power of the third laser beam.

In an exemplary embodiment, an irradiation speed of the second laser beam may be faster than an irradiation speed of the third laser beam.

In an exemplary embodiment of the inventive concepts, a laser machining method includes forming a through-hole in a processing object including a first layer and a second layer of which a thermal deformation temperature is higher than a thermal deformation temperature of the first layer. The forming of the through-hole includes performing a first irradiation process of irradiating a first laser beam to the first layer along a first boundary, performing a second irradiation process of irradiating a second laser beam to the first layer along a second boundary after the performing of the first irradiation process, and performing a third irradiation process of irradiating a third laser beam to the second layer along the second boundary. A time interval between the first irradiation process and the second irradiation process is different from a time interval between the second irradiation process and the third irradiation process.

In an exemplary embodiment, the second boundary may be surrounded by the first boundary in a plan view.

In an exemplary embodiment, power of the first laser beam may be lower than power of the second laser beam, and the power of the second laser beam may be equal to power of the third laser beam.

In an exemplary embodiment, an irradiation speed of the first laser beam may be faster than an irradiation speed of the second laser beam, and the irradiation speed of the second laser beam may be equal to an irradiation speed of the third laser beam.

In an exemplary embodiment, the third irradiation process of irradiating the third laser beam may be performed a plurality of times, and a first time interval between the third irradiation processes may be 0 second or greater than 0 second.

In an exemplary embodiment, the time interval between the first irradiation process and the second irradiation process may be greater than the first time interval.

In an exemplary embodiment, the second irradiation process of irradiating the second laser beam may be performed a plurality of times, and a second time interval between the second irradiation processes may be greater than the first time interval.

In an exemplary embodiment of the inventive concepts, a display module includes a base layer which defines a through-hole, a circuit layer disposed on the base layer, an emission layer disposed on the circuit layer, an encapsulation layer disposed on the emission layer, and an anti-reflection layer disposed on the encapsulation layer. Two or more concave portions may be defined in a sidewall portion defining the through-hole.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION

Figure 1A:
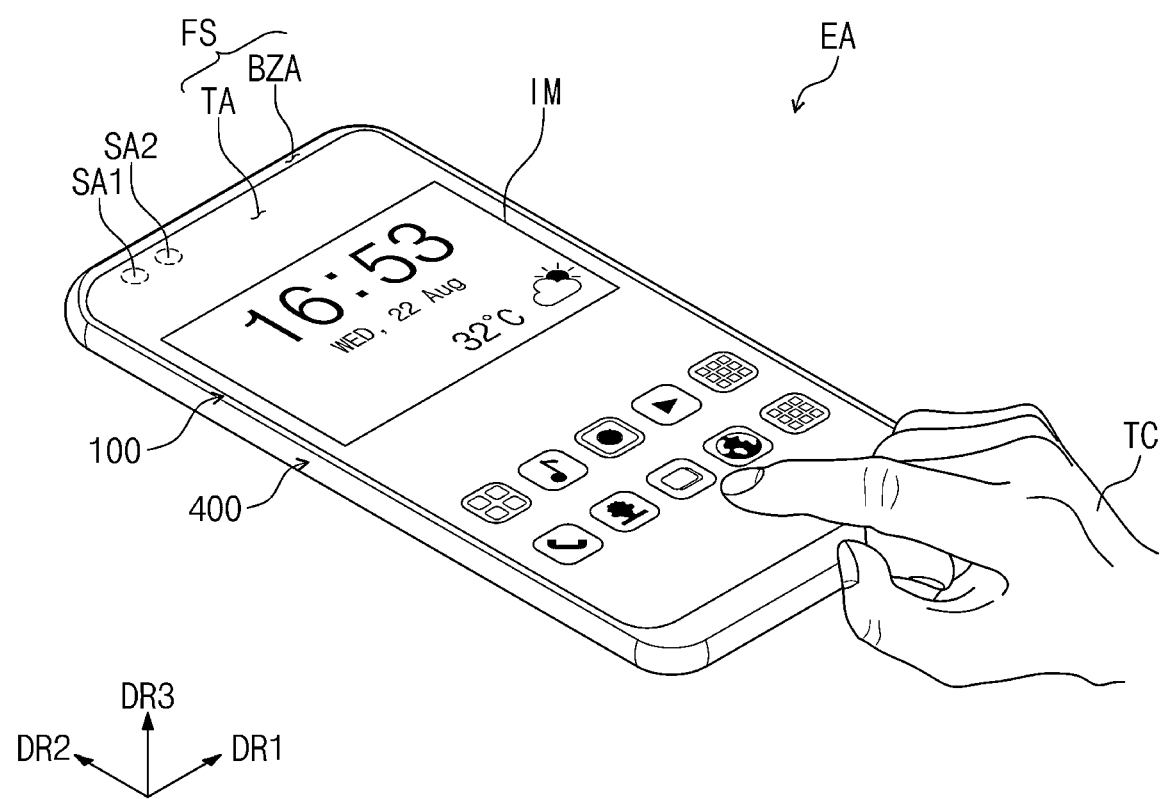
FIG. 1A is a perspective view illustrating an exemplary embodiment of a display device according to the inventive concepts.

The inventive concepts now will be described more fully hereinafter with reference to the accompanying drawings, in which various exemplary embodiments are shown. The inventive concepts may, however, be embodied in many different forms, and should not be construed as limited to the exemplary embodiments set forth herein. Rather, these exemplary embodiments are provided so that this disclosure will be thorough and complete, and will fully convey the scopes of the inventive concepts to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular exemplary embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the inventive concepts will be described in detail with reference to the accompanying drawings.

Figure 1B:
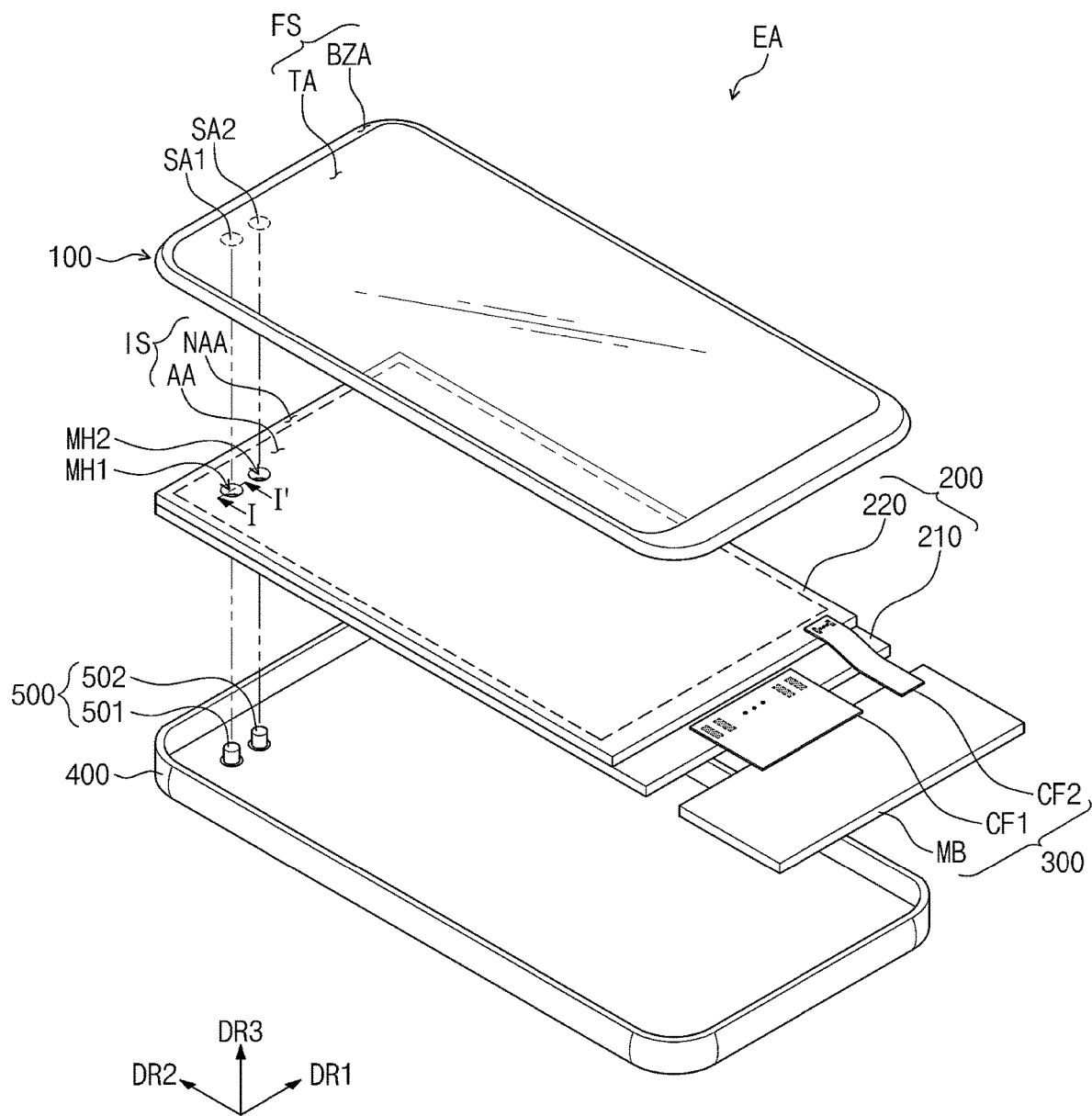
FIG. 1B is an exploded perspective view illustrating an exemplary embodiment of a display device according to the inventive concepts.

FIG. 1A is a perspective view illustrating an exemplary embodiment of a display device according to the inventive concepts. FIG. 1B is an exploded perspective view illustrating an exemplary embodiment of a display device according to the inventive concepts. Hereinafter, an exemplary embodiment of the inventive concepts will be described with reference to FIGS. 1A and 1B.

A display device EA may be activated by an electrical signal. The display device EA may be realized as various exemplary embodiments. For example, the display device EA may include such as a tablet, a notebook computer, a personal computer, a television, or a smart phone. Hereinafter, the smart phone is illustrated as an example of the display device EA.

The display device EA may display an image IM toward a third direction DR3 on a display surface FS parallel to first and second directions DR1 and DR2 as illustrated in FIG. 1A. Here, the first, second and third directions DR1 to DR3 are perpendicular to each other and follow directions of corresponding arrows respectively as illustrated in figures. The display surface FS on which the image IM is displayed may correspond to a front surface of the display device EA and may correspond to a front surface of a window 100. Hereinafter, the display surface and the front surface of the display device EA and the front surface of the window 100 will be indicated by the same reference designator. The image IM may include a dynamic image and a static image. In FIG. 1A, a time display box and application icons are illustrated as an example of the image IM.

Hereinafter, a front surface (or a top surface) and a rear surface (or a bottom surface) of each member may be defined based on a direction (e.g., the third direction DR3) in which the image IM is displayed. The front surface and the rear surface may be opposite to each other in the third direction DR3, and a normal direction of each of the front surface and the rear surface may be parallel to the third direction DR3. However, directions indicated by the first to third directions DR1, DR2 and DR3 may be relative concepts and may be changed into other directions.

The display device EA may include the window 100, a display module 200, a driving circuit unit 300, a housing 400, and electronic modules 500. In an exemplary embodiment, the window 100 and the housing 400 may be coupled to each other to form the exterior of the display device EA.

The window 100 may include an optically transparent insulating material. For example, the window 100 may include glass or plastic. The window 100 may have a single-layered structure or a multi-layered structure. For example, the window 100 may include a plurality of plastic films coupled to each other by an adhesive or may include a glass substrate and a plastic film coupled to each other by an adhesive.

The window 100 may include a transmission area TA and a bezel area BZA when viewed in a plan view. The clause "when viewed in a plan view" or "in a plan view" used herein means a clause "when viewed in a direction opposite to the third direction DR3". In addition, the term "thickness direction" means the third direction DR3.

The transmission area TA may be optically transparent. A light transmittance of the bezel area BZA may be less than a light transmittance of the transmission area TA. The bezel area BZA may define a shape of the transmission area TA. The bezel area BZA may be adjacent to the transmission area TA and may surround the transmission area TA in a plan view.

The bezel area BZA may have a predetermined color. The bezel area BZA may cover a peripheral area NAA of the display module 200 to prevent the peripheral area NAA from being visible to the outside. However, the inventive concepts are not limited thereto. In another exemplary embodiment of the inventive concepts, the bezel area BZA may be omitted in the window 100.

In an exemplary embodiment, sensor areas SA1 and SA2 may be areas overlapping with the electronic modules 500. The electronic modules 500 will be described later in detail. The display device EA may receive external signals required for the electronic modules 500 through the sensor areas SA1 and SA2 and/or may provide signals outputted from the electronic modules 500 to the outside through the sensor areas SA1 and SA2. According to the inventive concepts, the sensor areas SA1 and SA2 may be defined to overlap with the transmission area TA. Thus, an additional area for the sensor areas SA1 and SA2 outside the transmission area TA may be omitted. Thus, an area (or size) of the bezel area BZA may be reduced.

In FIG. 1B, two sensor areas SA1 and SA2 are illustrated as an example. However, the inventive concepts are not limited thereto. In certain exemplary embodiments, the number of the sensor areas may be three or more, or one of the sensor areas SA1 and SA2 may be omitted and a single sensor area may be defined. In addition, the sensor areas SA1 and SA2 are defined at the top left of the transmission area TA in FIG. 1B. Alternatively, the sensor areas SA1 and SA2 may be defined at one of other various positions such as the top right, the central portion, the bottom left and the bottom right of the transmission area TA. In a certain exemplary embodiment, first sensor area SA1 may be defined at the top left of the transmission area TA, and second sensor area SA2 may be defined at the top right of the transmission area TA.

The display module 200 may be disposed under the window 100. The term 'under' used herein means a direction opposite to a direction in which the display module 200 provides an image (i.e., a direction opposite to the third direction DR3). The display module 200 may display the image IM and may sense an external input TC. The display module 200 may include a front surface IS including an active area AA and the peripheral area NAA. The active area AA may be an area that is activated by an electrical signal.

In an exemplary embodiment, the active area AA may be an area in which the image IM is displayed and may also be an area in which the external input TC is sensed. The transmission area TA may overlap with at least the active area AA. For example, the transmission area TA may overlap with the whole or at least a portion of the active area AA. Thus, a user may view the image IM through the transmission area TA and/or may provide the external input TC through the transmission area TA.

The peripheral area NAA may be covered by the bezel area BZA. The peripheral area NAA may be adjacent to the active area AA. The peripheral area NAA may surround the active area AA when viewed in a plan view. A driving circuit and/or driving lines for driving the active area AA may be disposed in the peripheral area NAA.

In an exemplary embodiment, the display module 200 may be assembled in a flat state where the active area AA and the peripheral area NAA face the window 100. However, the inventive concepts are not limited thereto. In another exemplary embodiment, a portion of the peripheral area NAA may be bent. In this case, a portion of the peripheral area NAA may face a rear surface of the display device EA, and thus an area (or size) of the bezel area BZA in the front surface of the display device EA may be reduced. In still another exemplary embodiment, the display module 200 may be assembled in a state where a portion of the active area AA is also bent. In yet another exemplary embodiment, the peripheral area NAA may be omitted in the display module 200.

The display module 200 may include a display panel 210 and an input sensing layer 220.

The display panel 210 may be a component which substantially generates the image IM. The image IM generated from the display panel 210 may be displayed on the front surface IS and may be visible to a user through the transmission area TA.

The input sensing layer 220 may sense the external input TC applied from the outside. For example, the input sensing layer 220 may sense the external input TC provided to the window 100. The external input TC may be a user's input. The user's input may include at least one of various external inputs such as a part (e.g., a finger) of a user's body, light, heat, a pen, and pressure. In an exemplary embodiment of FIG. 1A, a user's hand applied to the front surface FS is illustrated as an example of the external input TC. However, the inventive concepts are not limited thereto. In other words, the external input TC may be provided in various forms, as described above. In certain exemplary embodiments, the display device EA may also sense the external input TC applied to a side surface and/or a rear surface of the display device EA depending on a structure of the display device EA.

The driving circuit unit 300 may be electrically connected to the display panel 210 and the input sensing layer 220. The driving circuit unit 300 may include a main circuit board MB, a first flexible film CF1, and a second flexible film CF2.

The first flexible film CF1 may be electrically connected to the display panel 210. The first flexible film CF1 may connect the display panel 210 and the main circuit board MB. The first flexible film CF1 may be connected to pads (display pads) of the display panel 210. The pads are disposed in the peripheral area NAA. The first flexible film CF1 may provide electrical signals for driving the display panel 210 to the display panel 210. The electrical signals may be generated in the first flexible film CF1 or may be generated in the main circuit board MB.

The second flexible film CF2 may be electrically connected to the input sensing layer 220. The second flexible film CF2 may connect the input sensing layer 220 and the main circuit board MB. The second flexible film CF2 may be connected to pads (sensing pads) of the input sensing layer 220. The pads are disposed in the peripheral area NAA. The second flexible film CF2 may provide electrical signals for driving the input sensing layer 220 to the input sensing layer 220. The electrical signals may be generated in the second flexible film CF2 or may be generated in the main circuit board MB.

The main circuit board MB may include various kinds of driving circuits for driving the display module 200 and/or a connector for supplying power. The first flexible film CF1 and the second flexible film CF2 may be connected to the main circuit board MB. According to an exemplary embodiment of the inventive concepts, the display module 200 may be easily controlled through one main circuit board MB. However, the inventive concepts are not limited thereto. In other exemplary embodiments, the display panel 210 and the input sensing layer 220 of the display module 200 may be connected to different main circuit boards, or one of the first and second flexible films CF1 and CF2 may not be connected to the main circuit board MB.

In an exemplary embodiment, a portion of the display module 200, which corresponds to the sensor areas SA1 and SA2, may have a transmittance higher than that of the active area AA not overlapping with the sensor areas SA1 and SA2. For example, a portion of the display panel 210 and a portion of the input sensing layer 220, which correspond to the sensor areas SA1 and SA2, may be removed. Thus, the electronic modules 500 overlapping with the sensor areas SA1 and SA2 may easily transmit and/or receive signals through the sensor areas SA1 and SA2.

FIG. 1B illustrates an example in which predetermined holes MH1 and MH2 (hereinafter, referred to as through-holes MH1 and MH2) are defined in areas of the display module 200 which correspond to the sensor areas SA1 and SA2. The through-holes MH1 and MH2 may be defined in the active area AA and may penetrate the display module 200. The through-holes MH1 and MH2 may penetrate the display panel 210 and the input sensing layer 220. In other words, the through-holes MH1 and MH2 may be formed by removing the portion of the display panel 210 and the portion of the input sensing layer 220, which overlap with the sensor areas SA1 and SA2. Since the through-holes MH1 and MH2 are defined in the active area AA, the sensor areas SA1 and SA2 may be provided in the transmission area TA.

The electronic modules 500 may include a first electronic module 501 and a second electronic module 502. The first and second electronic modules 501 and 502 may overlap with the through-holes MH1 and MH2 and overlap with the sensor areas SA1 and SA2 when viewed in a plan view. The first and second electronic modules 501 and 502 may be disposed under the display module 200. At least portions of the first and second electronic modules 501 and 502 may be received in the through-holes MH1 and MH2. The first and second electronic modules 501 and 502 may receive external inputs transmitted through the sensor areas SA1 and SA2 and/or may provide output signals through the sensor areas SA1 and SA2.

The housing 400 may be coupled to the window 100. The housing 400 and the window 100 may be coupled to each other to provide an inner space. The display module 200 and the electronic modules 500 may be accommodated in the inner space.

The housing 400 may be formed of a material having relatively high rigidity. For example, the housing 400 may include a plurality of frames and/or plates formed of glass, plastic, a metal, or a combination thereof. The housing 400 may stably protect components of the display device EA accommodated in the inner space from an external impact.

Figure 2:
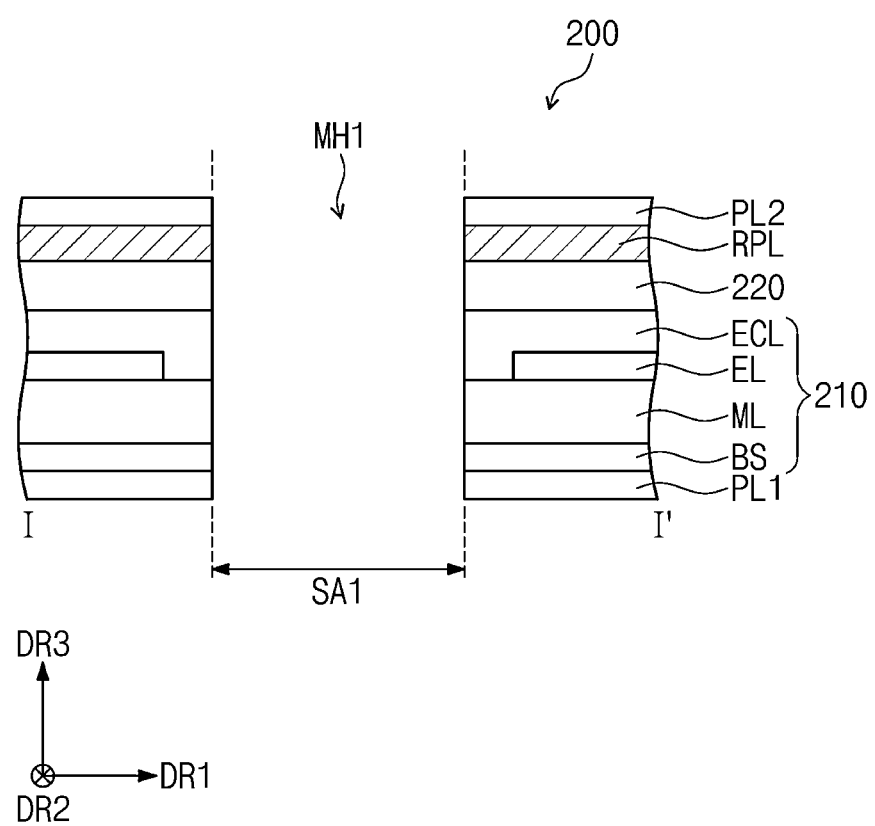
FIG. 2 is a cross-sectional view taken along line I-I' of FIG. 1B.

FIG. 2 is a cross-sectional view taken along line I-I' of FIG. 1B.

Referring to FIG. 2, the display module 200 may include an anti-reflection layer RPL, a first protective film PL1, and a second protective film PL2 in addition to the display panel 210 and the input sensing layer 220 described above. However, the inventive concepts are not limited thereto. In another exemplary embodiment, the first and second protective films PL1 and PL2 may be omitted.

The display panel 210 may include a base layer BS, a circuit layer ML, an emission layer EL, and an encapsulation layer ECL.

The base layer BS may include a flexible material. For example, the base layer BS may be a plastic substrate. In an exemplary embodiment, the plastic substrate may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. For example, the base layer BS may include a single layer formed of a polyimide-based resin. However, the inventive concepts are not limited thereto. In another exemplary embodiment, the base layer BS may be a stack structure including a plurality of insulating layers.

The circuit layer ML may be disposed on the base layer BS. The circuit layer ML may include a plurality of insulating layers, a plurality of conductive layers, and a semiconductor layer.

The emission layer EL may be disposed on the circuit layer ML. The emission layer EL may include a display element. For example, the emission layer EL of an organic light emitting display panel may include an organic light emitting material as a display element. The emission layer EL of a quantum-dot light emitting display panel may include quantum dots and/or quantum rods as a display element.

The encapsulation layer ECL may encapsulate the emission layer EL. In some exemplary embodiments, the encapsulation layer ECL may include a plurality of inorganic layers and at least one organic layer disposed between the inorganic layers.

The first protective film PL1 may be disposed under the display panel 210. The first protective film PL1 may be adhered to a rear surface of the display panel 210 to protect the display panel 210. The first protective film PL1 may be a polyimide film or a polyethylene terephthalate ("PET") film, for example.

The input sensing layer 220 may be disposed on the display panel 210. The input sensing layer 220 may have a panel-type or layer-type multi-layered structure. The panel-type input sensing layer 220 may be coupled to the display panel 210 by an optically-clear-adhesive member disposed between the input sensing layer 220 and the display panel 210. The layer-type input sensing layer 220 may be disposed directly on a base surface provided by the display panel 210, and the base surface may be a top surface of the encapsulation layer ECL.

The input sensing layer 220 may include a sensing electrode, a signal line connected to the sensing electrode, and at least one insulating layer. The input sensing layer 220 may sense an external input by, for example, a capacitive method. However, the inventive concepts are not limited to the capacitive sensing method of the input sensing layer 220. In other exemplary embodiments, the input sensing layer 220 may sense an external input by an electromagnetic induction method or a pressure sensing method.

The anti-reflection layer RPL may be disposed on the input sensing layer 220. The anti-reflection layer RPL may reduce a reflectance of external light incident from an upside of the window 100 (see FIG. 1A).

The anti-reflection layer RPL according to an exemplary embodiment of the inventive concepts may include a retarder and a polarizer. The retarder may be a film type or a liquid crystal coating type and may include a 212 retarder and/or a 214 retarder. The polarizer may also be a film type or a liquid crystal coating type. The film type of the polarizer may include an extendable synthetic resin film, and the liquid crystal coating type of the polarizer may include arranged liquid crystals. The retarder and the polarizer may further include a protective film. The retarder and the polarizer may be defined as a base layer of the anti-reflection layer RPL, or the protective film may be defined as the base layer of the anti-reflection layer RPL.

The anti-reflection layer RPL according to an exemplary embodiment of the inventive concepts may include color filters. The color filters may be arranged in a predetermined form. The arrangement of the color filters may be determined in consideration of light emitting colors of pixels included in the display panel 210. The anti-reflection layer RPL may further include a black matrix adjacent to the color filters.

The anti-reflection layer RPL according to an exemplary embodiment of the inventive concepts may include a destructive interference structure. For example, the destructive interference structure may include a first reflective layer and a second reflective layer which are disposed on different layers from each other. First reflected light and second reflected light respectively reflected from the first reflective layer and the second reflective layer may destructively interfere with each other, and thus a reflectance of external light may be reduced.

The second protective film PL2 may be disposed on the anti-reflection layer RPL. In an exemplary embodiment, the second protective film PL2 may be removed when the display module 200 is coupled to the window 100 (see FIG. 1A). Alternatively, the second protective film PL2 may remain in a final product. In this case, the second protective film PL2 may be a transparent protective film.

The through-hole MH1 may be formed by removing a portion of the display module 200 which correspond to a first sensor area SA1. A structure for blocking a permeating path of external moisture and/or oxygen may be disposed around the through-hole MH1. In addition, the emission layer EL may be spaced apart from the through-hole MH1. Thus, even though the through-hole MH1 is defined or formed, the emission layer EL may be covered by the encapsulation layer ECL.

Figure 3:
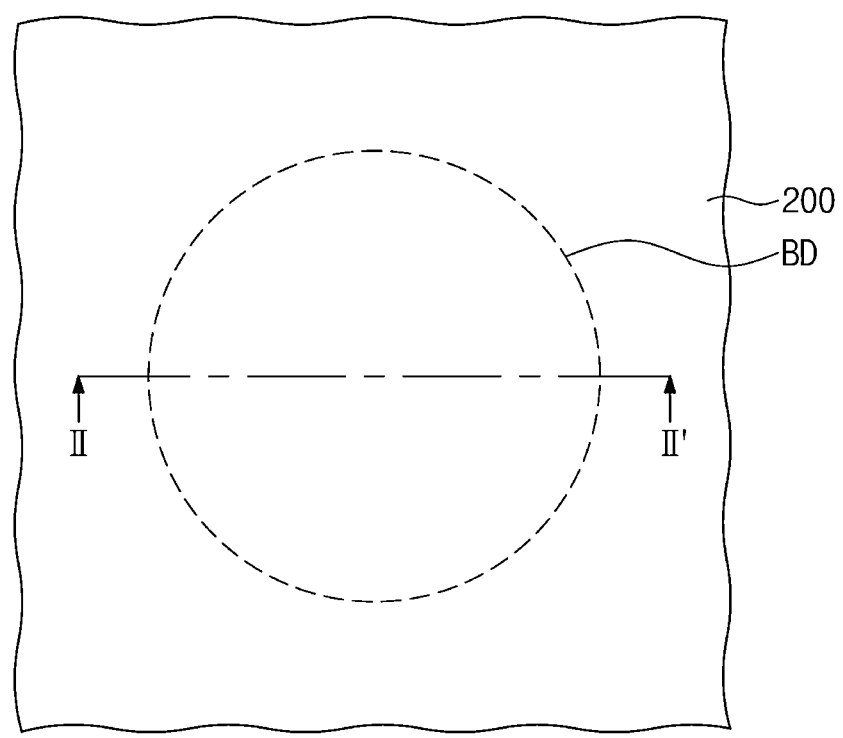
FIG. 3 is an enlarged, bottom plan view illustrating an exemplary embodiment of a portion of a display module before a through-hole is formed according to the inventive concepts.
Figure 4:
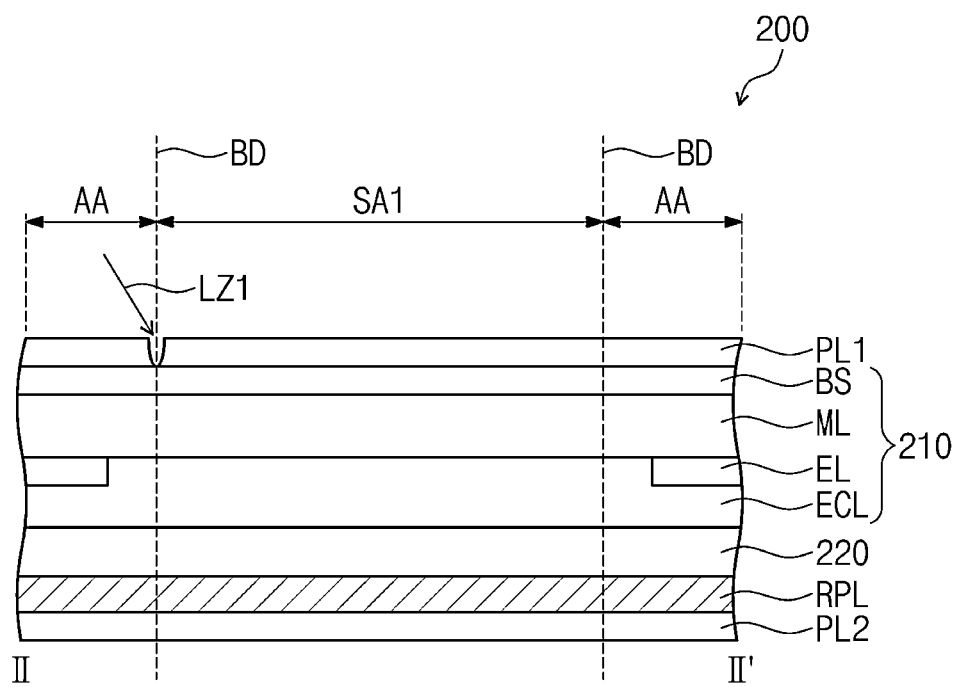
FIG. 4 is a cross-sectional view taken along line II-IF of FIG. 3 during a first cutting process.
Figure 4:
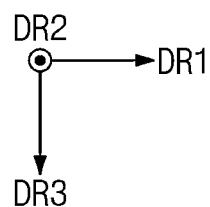

FIG. 3 is an enlarged, bottom plan view illustrating an exemplary embodiment of a portion of a display module before a through-hole is formed according to the inventive concepts. FIG. 4 is a cross-sectional view taken along line II-II' of FIG. 3 during a first cutting process. Hereinafter, an exemplary embodiment of the inventive concepts will be described with reference to FIGS. 3 and 4.

A laser patterning process may be used to form the through-hole MH1 (see FIG. 1B) penetrating the display module 200 from a bottommost surface to a topmost surface of the display module 200. The display module 200 may be a processing object (i.e., an object to be processed).

A boundary BD defining the through-hole MH1 (see FIG. 1B) is illustrated in the rear surface of the display module 200. The boundary BD may be circular in shape. The boundary BD may correspond to the first sensor area SA1. A laser beam may be irradiated corresponding to the boundary BD. In FIG. 3, the circular boundary BD is illustrated as an example. However, the inventive concepts are not limited thereto. For example, a processed shape may be one of various shapes such as polygonal shapes and a closed-loop shape including at least one curvature portion.

A laser beam LZ1 may be irradiated to the display module 200 from in the third direction DR3. In the present specification, irradiating the laser beam LZ1 to the boundary BD may be defined as an irradiation process.

Power, a processing speed and a frequency of the laser beam LZ1 used in the laser patterning process may be variously changed depending on a kind of the processing object and/or a patterning depth. For example, the power of the laser beam LZ1 may be selected in a range of 0.5 watt (W) to 30 W, the processing speed of the laser beam LZ1 may be selected in a range of 50 millimeters per second (mm/s) to 6,000 mm/s, and the frequency of the laser beam LZ1 may be selected in a range of 100 kilohertz (kHz) to 20,000 kHz. However, the power, the processing speed and the frequency of the laser beam LZ1 according to the inventive concepts are not limited to the ranges. In addition, the power and the processing speed of the laser beam LZ1 may be changed depending on a layer to which the laser beam LZ1 is irradiated.

Figure 5A:
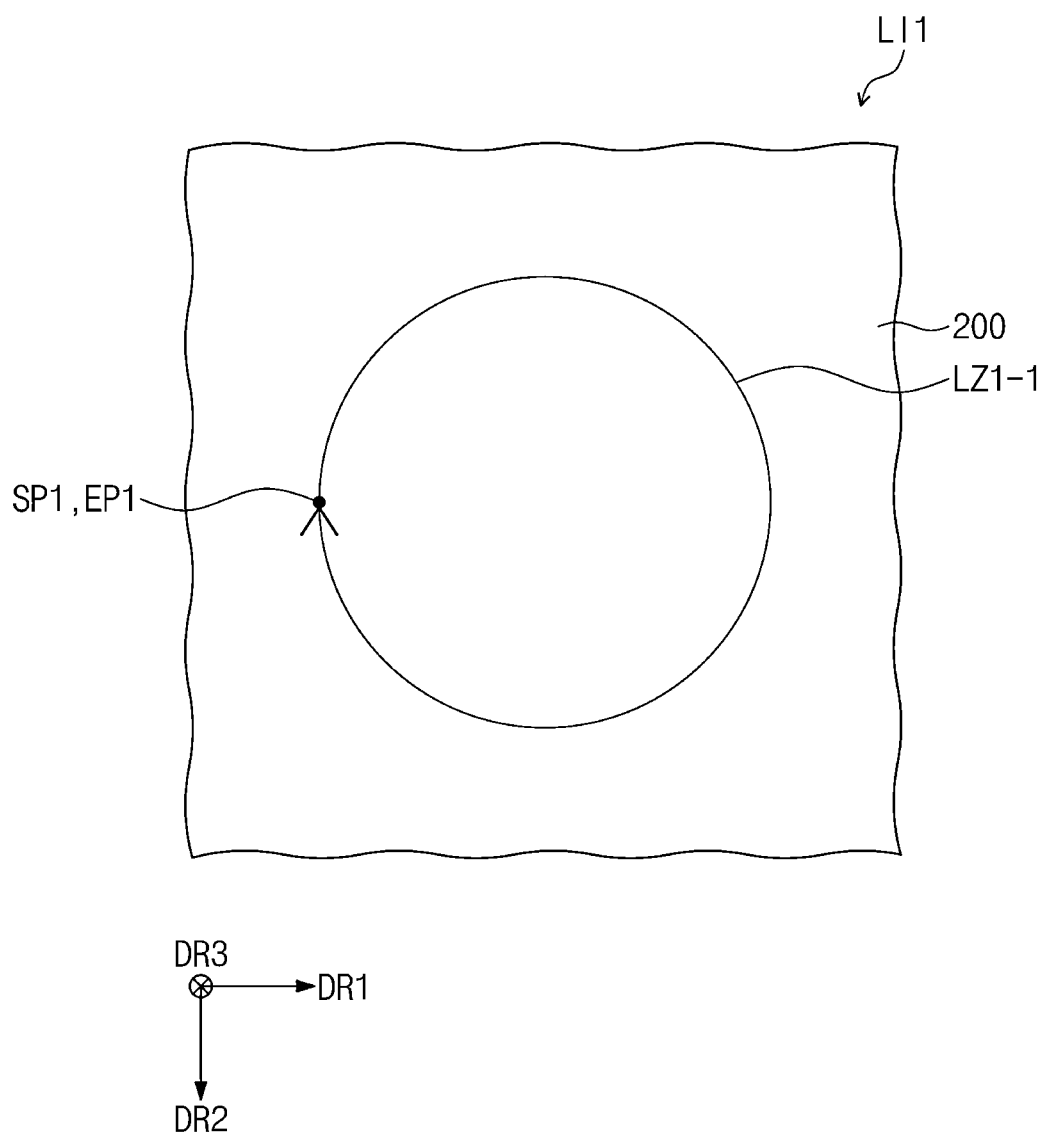
FIG. 5A is a view illustrating an exemplary embodiment of a laser machining method during the first cutting process according to the inventive concepts.
Figure 5B:
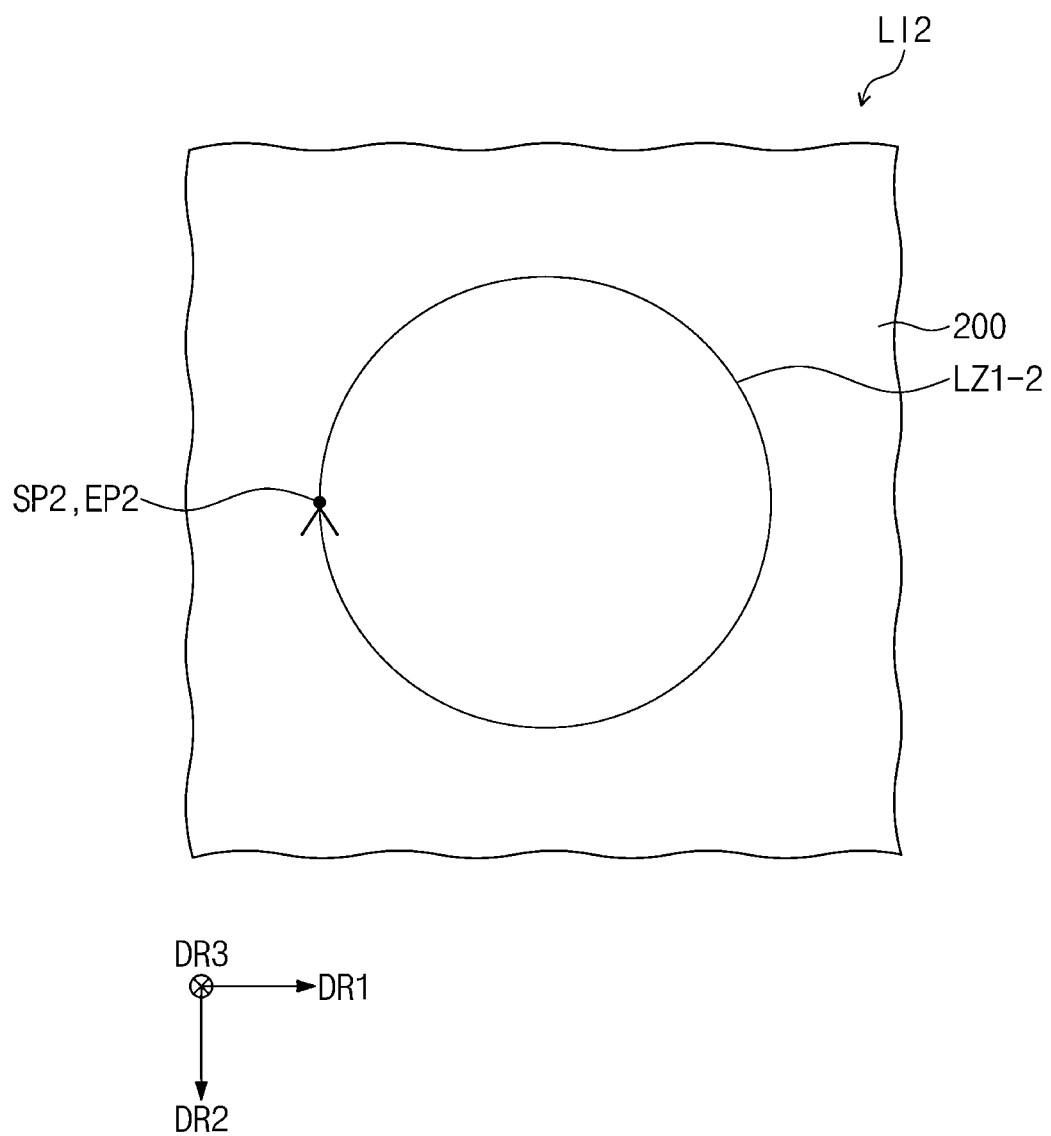
FIG. 5B is a view illustrating an exemplary embodiment of a laser machining method during the first cutting process according to the inventive concepts.

FIG. 5A is a view illustrating an exemplary embodiment of a laser machining method during the first cutting process according to the inventive concepts. FIG. 5B is a view illustrating an exemplary embodiment of a laser machining method during the first cutting process according to the inventive concepts. Hereinafter, an exemplary embodiment of the inventive concepts will be described with reference to FIGS. 4, 5A and 5B.

The display module 200 including a plurality of layers may be prepared. The plurality of layers may include the first protective film PL1, the display panel 210, the input sensing layer 220, the anti-reflection layer RPL, and the second protective film PL2. The through-hole MH1 (see FIG. 1B) may be formed in the display module 200.

FIGS. 5A and 5B are views illustrating a first cutting process for forming the through-hole MH1. For example, the first cutting process may include at least one irradiation process of irradiating the laser beam LZ1 (hereinafter, referred to as a first laser beam LZ1). Portions of the first protective film PL1, the display panel 210 and the input sensing layer 220, which correspond to the boundary BD, may be cut during the first cutting process.

The first cutting process may include one irradiation process or may include a plurality of irradiation processes. In an exemplary embodiment, the first cutting process may include a first irradiation process LI1 and a second irradiation process LI2. The second irradiation process LI2 may be performed after the first irradiation process LI1.

A path LZ1-1 of the first laser beam LZ1 in the first irradiation process LI1 is illustrated in FIG. 5A. A path LZ1-2 of the first laser beam LZ1 in the second irradiation process LI2 is illustrated in FIG. 5B.

In the first irradiation process LI1, a start point SP1 and an end point EP1 of the path LZ1-1 may be the same as each other. In addition, in the second irradiation process LI2, a start point SP2 and an end point EP2 of the path LZ1-2 may be the same as each other. In other words, in each of the first and second irradiation processes LI1 and LI2, the first laser beam LZ1 may be irradiated to the entire portion of the boundary BD. In addition, the end point EP1 of the path LZ1-1 may be the same as the start point SP2 of the path LZ1-2. For example, the first laser beam LZ1 may be irradiated along a first boundary in the first irradiation process LI1, and the first laser beam LZ1 may be irradiated along the first boundary in the second irradiation process LI2. The first boundary may correspond to the boundary BD.

In an exemplary embodiment, the first irradiation process LI1 and the second irradiation process LI2 may be continuously performed. Thus, a first time interval between an end time of the first irradiation process LI1 and a start time of the second irradiation process LI2 may be 0 second. However, the inventive concepts are not limited thereto. In another exemplary embodiment, the first time interval may be greater than 0 second. For example, the first time interval may range from 0 second to 1 second. However, the range of the first time interval is not limited thereto.

In certain exemplary embodiments, when the first time interval is greater than 0 second, the first time interval may be provided immediately after each of the irradiation processes or may be provided immediately after a plurality of the irradiation processes. For example, when the first cutting process includes ten irradiation processes, a time interval between some irradiation processes may be different from a time interval between other irradiation processes. For example, time intervals between first to fifth irradiation processes and time intervals between sixth to tenth irradiation processes may be 0 second, and a time interval between the fifth irradiation process and the sixth irradiation process may be greater than 0 second.

A diameter of the boundary BD may be 5 mm or less. Since the diameter of the boundary BD is small, after the first laser beam LZ1 is irradiated one time, heat may not be sufficiently diffused around the start point immediately. In this case, when the first laser beam LZ1 is repeatedly irradiated to the boundary BD without a time interval between the irradiation processes, heat may be accumulated in the display module 200. Thus, an area (or size) of a heat affected zone may increase, and/or a bubble may be generated between the layers of the display module 200 by thermal deformation. However, according to the exemplary embodiments of the inventive concepts, the time interval may be provided between the irradiation processes to secure a time in which heat provided to the processing object is diffused. As a result, it is possible to prevent the area of the heat affected zone from increasing, and thus occurrence of defects may be minimized and reliability of the product may be improved.

Figure 6:
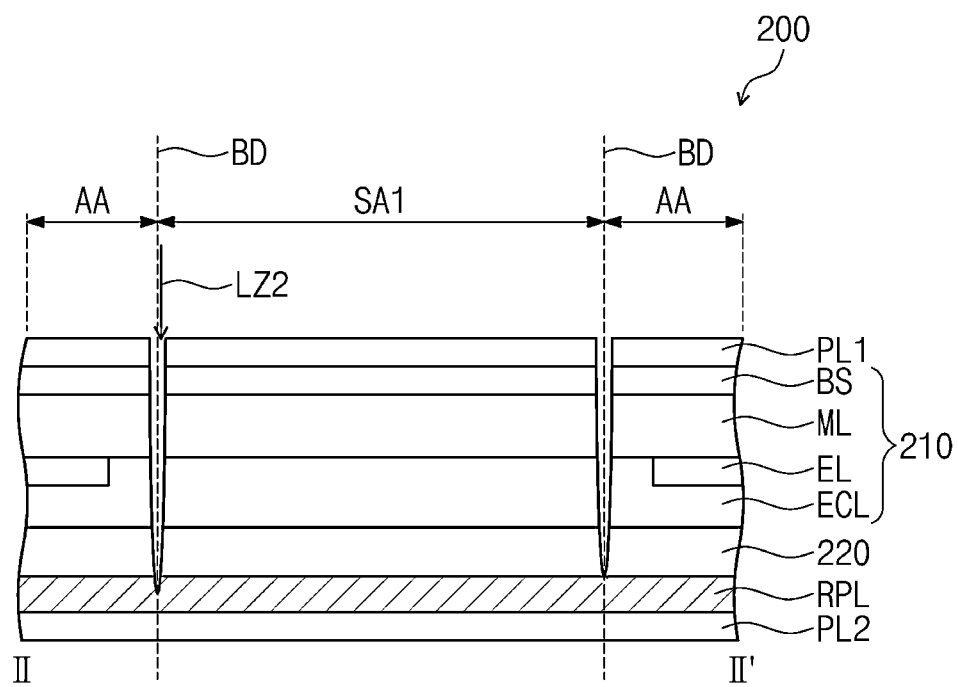
FIG. 6 is a cross-sectional view taken along the line II-IF of FIG. 3 during a second cutting process.
Figure 6:
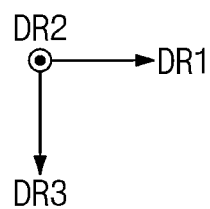
Figure 7A:
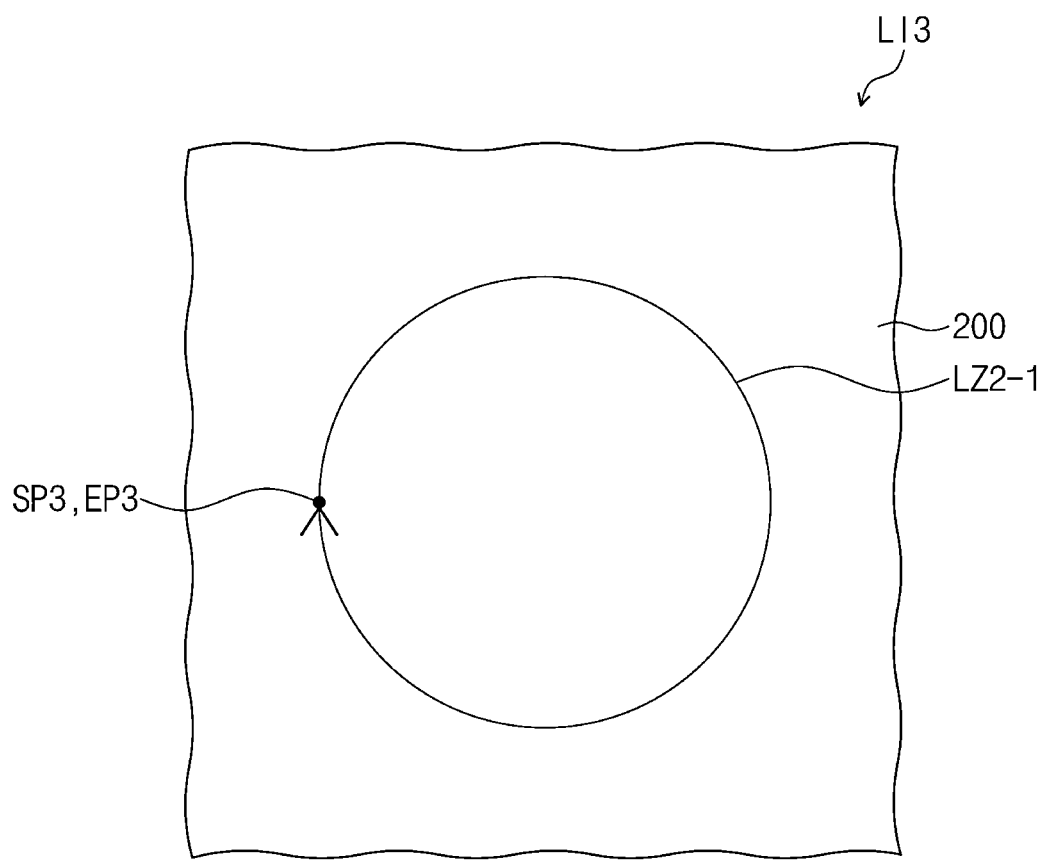
FIG. 7A is a view illustrating an exemplary embodiment of a laser machining method during the second cutting process according to the inventive concepts.
Figure 7B:
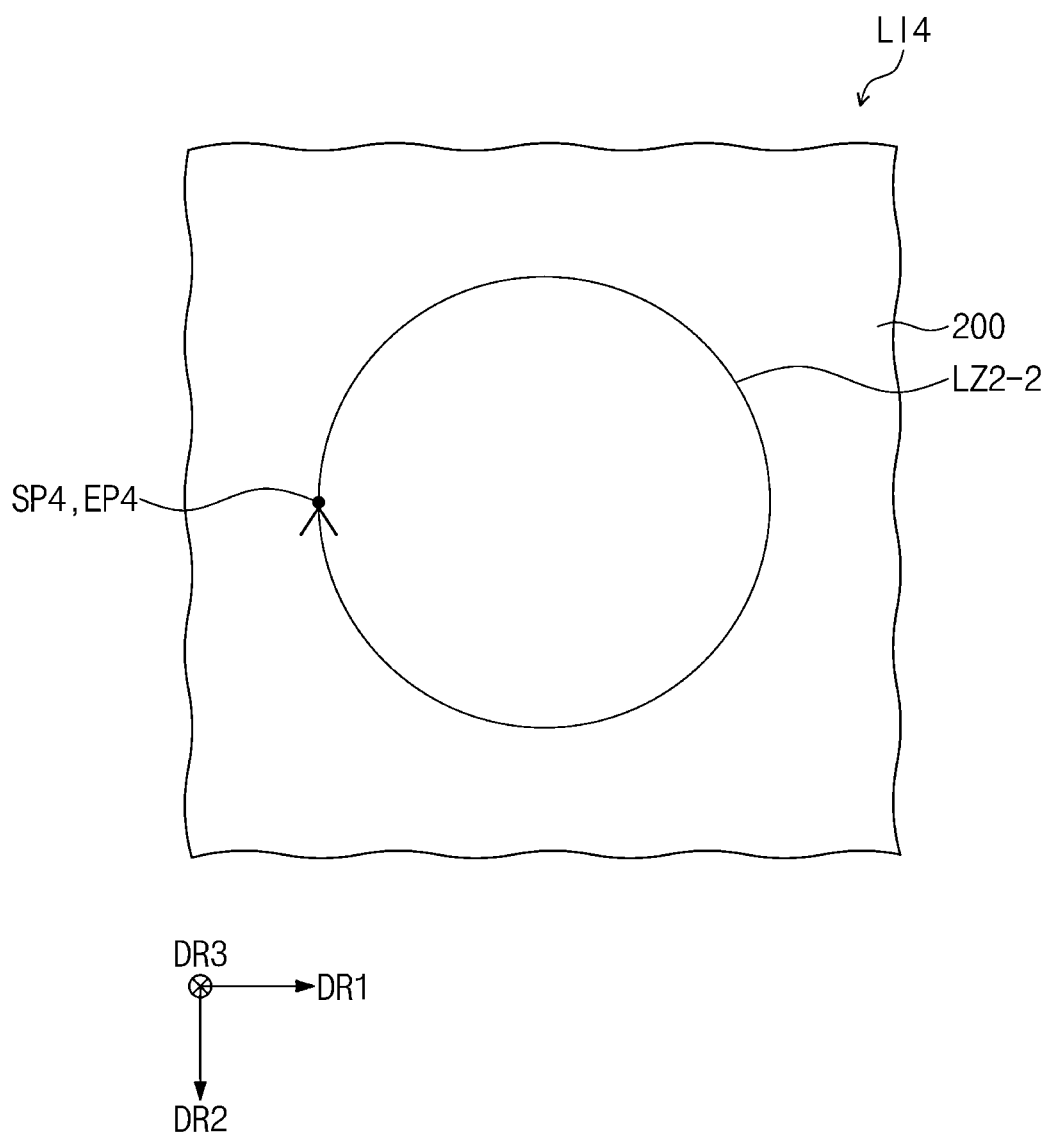
FIG. 7B is a view illustrating an exemplary embodiment of a laser machining method during the second cutting process according to the inventive concepts.

FIG. 6 is a cross-sectional view taken along the line II-IF of FIG. 3 during a second cutting process. FIG. 7A is a view illustrating an exemplary embodiment of a laser machining method during the second cutting process according to the inventive concepts. FIG. 7B is a view illustrating an exemplary embodiment of a laser machining method during the second cutting process according to the inventive concepts. Hereinafter, an embodiment of the inventive concepts will be described with reference to FIGS. 4, 5A, 5B, 6, 7A and 7B.

The time interval described above may be adjusted depending on properties of layers included in the processing object. For example, the display module 200 may include a plurality of layers. Thermal deformation temperatures of the plurality of layers may be different from each other. When a temperature is increased, the deformation by heat may rapidly occur as the thermal deformation temperature of a layer is relatively low.

A laser beam LZ2 (hereinafter, referred to as a second laser beam LZ2) may be irradiated to the display module 200. The second laser beam LZ2 may be irradiated to the anti-reflection layer RPL. The anti-reflection layer RPL of the display module 200 may have a thermal deformation temperature lower than those of the base layer BS, the circuit layer ML, the emission layer EL, the encapsulation layer ECL and the input sensing layer 220. For example, the anti-reflection layer RPL may be formed by dyeing a polyvinyl alcohol ("PVA") film with an iodine compound. A thermal deformation temperature of the PVA film may be lower than those of other layers.

Irradiation processes of irradiating the second laser beam LZ2 to the anti-reflection layer RPL may be referred to as a second cutting process. The second cutting process may include a third irradiation process LI3 and a fourth irradiation process LI4. The fourth irradiation process LI4 may be performed after the third irradiation process LI3.

A path LZ2-1 of the second laser beam LZ2 in the third irradiation process LI3 is illustrated in FIG. 7A. A path LZ2-2 of the second laser beam LZ2 in the fourth irradiation process LI4 is illustrated in FIG. 7B.

In the third irradiation process LI3, a start point SP3 and an end point EP3 of the path LZ2-1 may be the same as each other. In addition, in the fourth irradiation process LI4, a start point SP4 and an end point EP4 of the path LZ2-2 may be the same as each other. For example, second laser beam LZ2 may be irradiated along a second boundary in the third irradiation process LI3, and the second laser beam LZ2 may be irradiated along a third boundary in the fourth irradiation process LI4. The second boundary and the third boundary may correspond to the boundary BD.

In an exemplary embodiment, a second time interval between an end time of the third irradiation process LI3 and a start time of the fourth irradiation process LI4 may be greater than 0 second. In an exemplary embodiment, the second time interval may be greater than the first time interval described with reference to FIGS. 5A and 5B. For example, the second time interval may range from 1 milliseconds (msec) to 10 seconds. However, the range of the second time interval is not limited thereto. As the second time interval increases, a time in which heat is diffused may increase. Thus, as the second time interval increases, an increase in area of a heat affected zone may be reduced. In an exemplary embodiment, the second time interval may be provided immediately after each of the irradiation processes.

According to an exemplary embodiment of the inventive concepts, the time interval between the irradiation processes of the laser machining method may be adjusted depending on the thermal deformation temperature of a target layer to be processed. For example, the time interval may be 0 second or omitted when the through-hole is formed in a layer having a relatively high thermal deformation temperature. On the contrary, when the through-hole is formed in a layer having a relatively low thermal deformation temperature, the time interval may be greater than 0 second or may be greater than time intervals of other layers having a relatively high thermal deformation temperature. Thus, heat damage of the processing object may be minimized or prevented by adjusting the time interval (e.g., a delay time before the start time of the next irradiation process).

In an exemplary embodiment, the second time interval may be provided every n irradiation processes of the second laser beam LZ2 in the second cutting process, and the first time interval may be provided every m irradiation processes of the first laser beam LZ1 in the first cutting process described with reference to FIGS. 5A and 5B. Here, 'n' and 'm' are natural numbers, and 'n' may be less than 'm'. Thus, when the laser beam is irradiated to the layer having the relatively low thermal deformation temperature (e.g., the second cutting process), the time interval between the irradiation processes may be provided more frequently than the time interval between the irradiation processes when the laser beam is irradiated to the layer having the relatively high thermal deformation temperature (e.g., the first cutting process).

The second laser beam LZ2 may be irradiated to a layer of which a thermal deformation temperature is lower than that of a layer to which the first laser beam LZ1 is irradiated. Power and an irradiation speed of the second laser beam LZ2 may be equal to or different from power and an irradiation speed of the first laser beam LZ1. For example, the power of the second laser beam LZ2 may be weaker than the power of the first laser beam LZ1. The irradiation speed of the second laser beam LZ2 may be faster than the irradiation speed of the first laser beam LZ1. Thus, a degree of thermal deformation of the layer to which the second laser beam LZ2 is irradiated may be reduced.

In an exemplary embodiment, the first laser beam LZ1 and the second laser beam LZ2 may be irradiated along the same boundary BD. However, the inventive concepts are not limited thereto.

In FIGS. 4 and 6, the cutting processes may be performed from the rear surface of the display module 200. For example, the cutting processes may be performed in a direction from the first protective film PL1 toward the second protective film PL2 (e.g., the third direction DR3). However, the inventive concepts are not limited thereto. In another exemplary embodiment, the cutting processes may be performed from a top surface (or a front surface) of the display module 200. In this case, the cutting processes may be performed in a direction from the second protective film PL2 toward the first protective film PL1 (e.g., the direction opposite to the third direction DR3).

In still another exemplary embodiment, the cutting processes may be performed on some of the components (e.g., layers) of the display module 200 in the direction from the first protective film PL1 toward the second protective film PL2, and the cutting processes may be performed on the others of the components of the display module 200 in the direction from the second protective film PL2 toward the first protective film PL1. For example, in FIG. 6, the cutting processes may be performed from the first protective film PL1 to the input sensing layer 220 in the direction from the first protective film PL1 toward the second protective film PL2, and the cutting processes may be performed from the second protective film PL2 to the anti-reflection layer RPL in the direction from the second protective film PL2 toward the first protective film PL1.

Figure 8A:
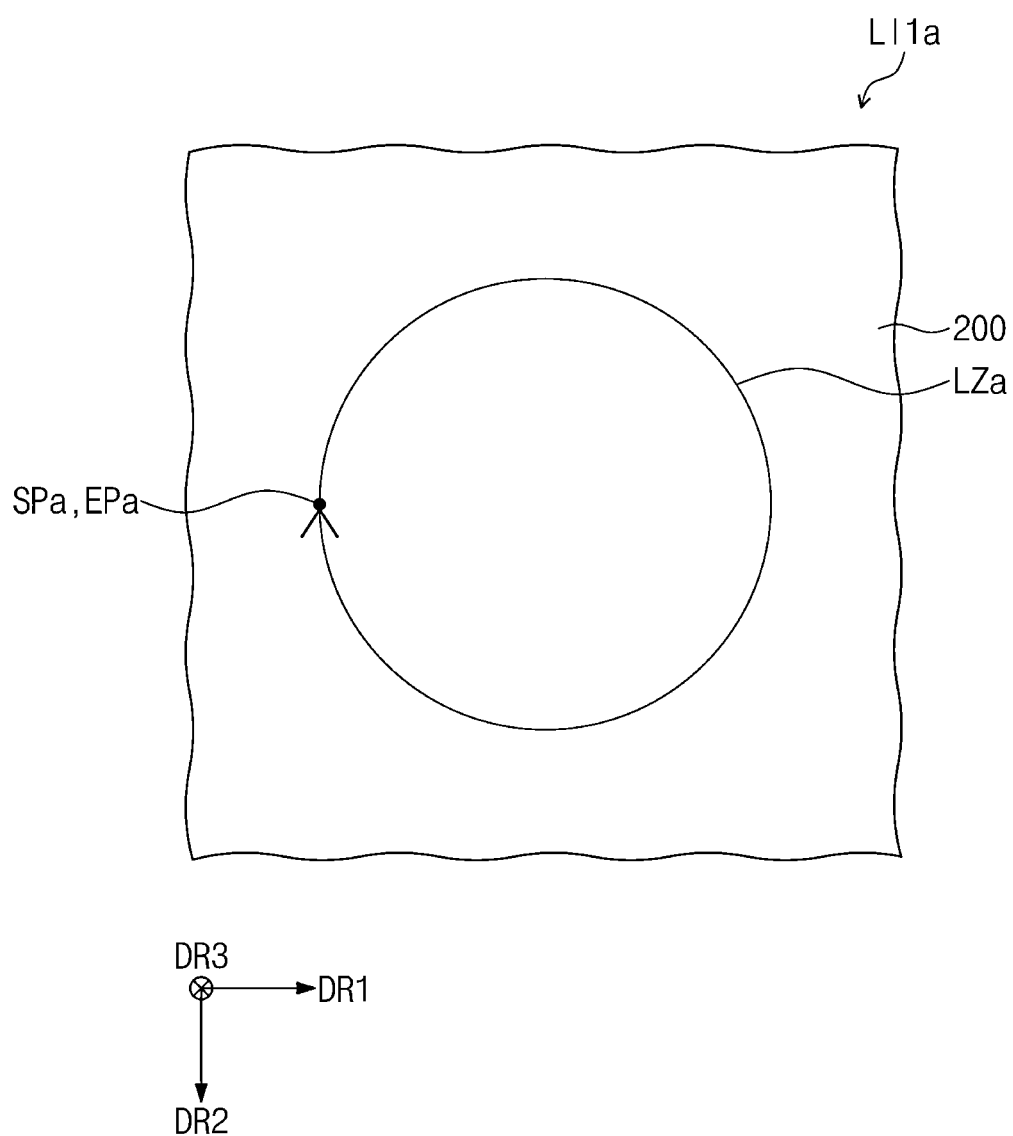
FIG. 8A is a view illustrating a part of another exemplary embodiment of a laser machining method according to the inventive concepts.
Figure 8B:
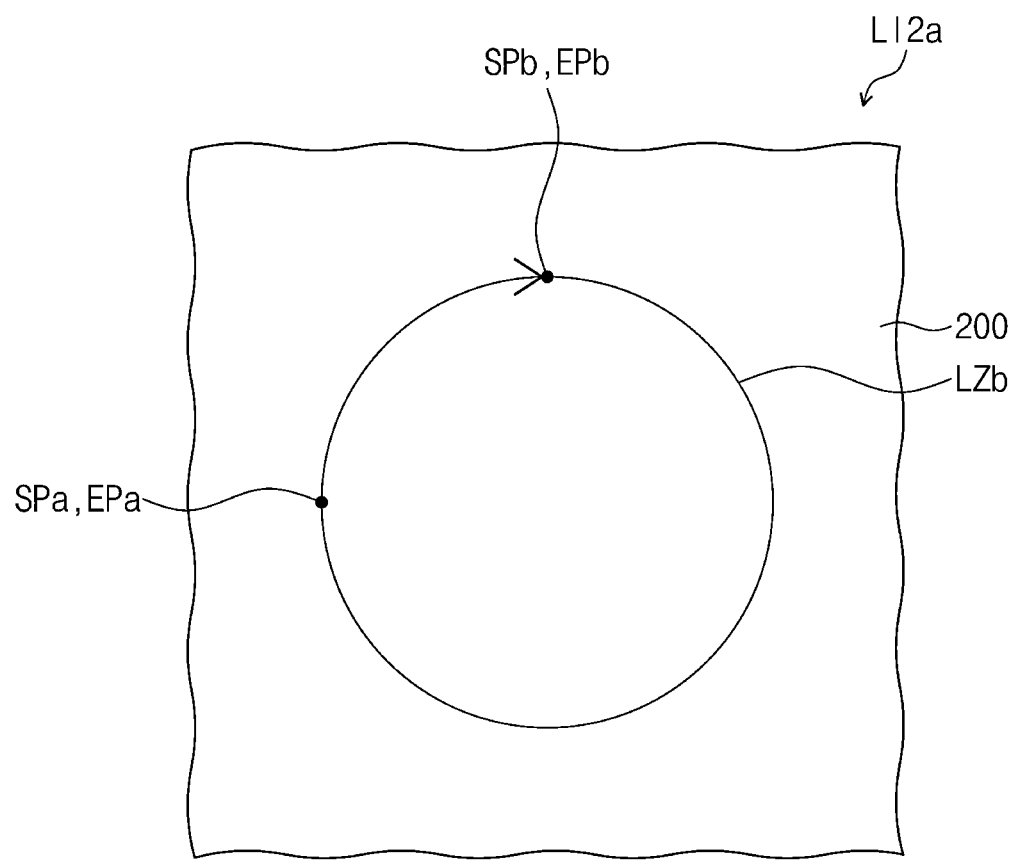
FIG. 8B is a view illustrating another part of the exemplary embodiment of a laser machining method according to the inventive concepts.
Figure 8C:
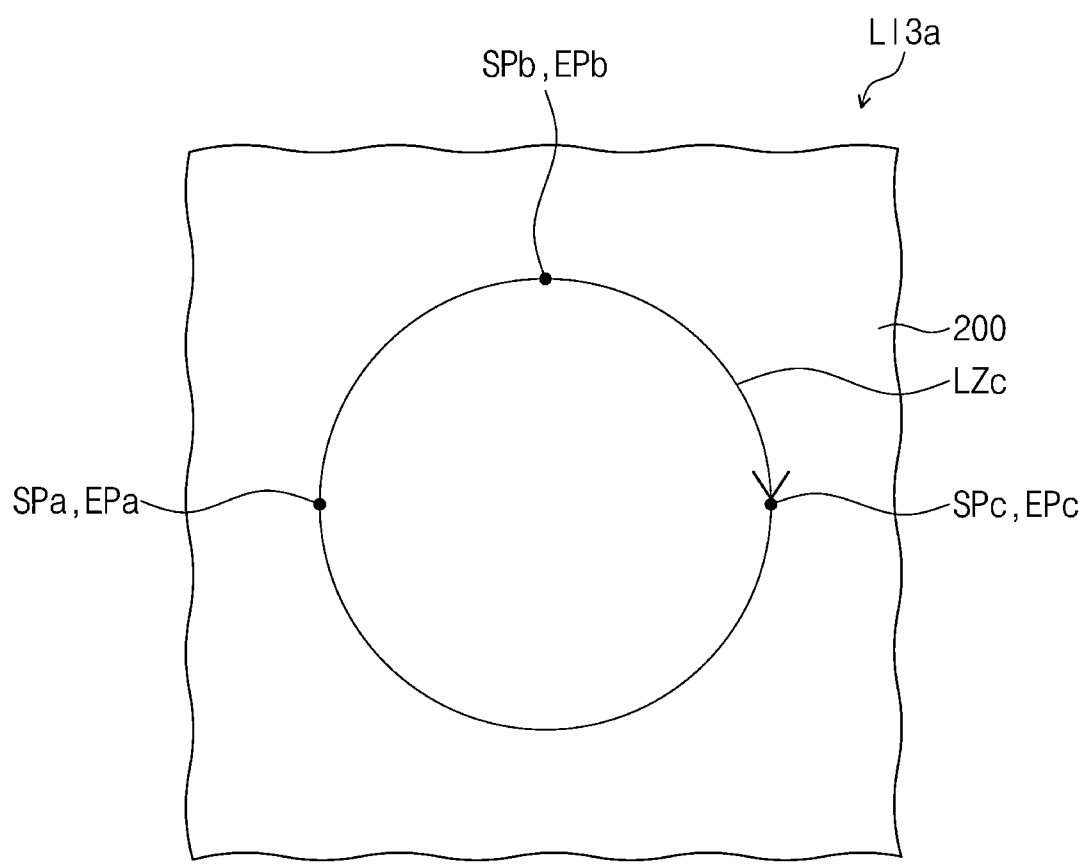
FIG. 8C is a view illustrating still another part of the exemplary embodiment of a laser machining method according to the inventive concepts.
Figure 8D:
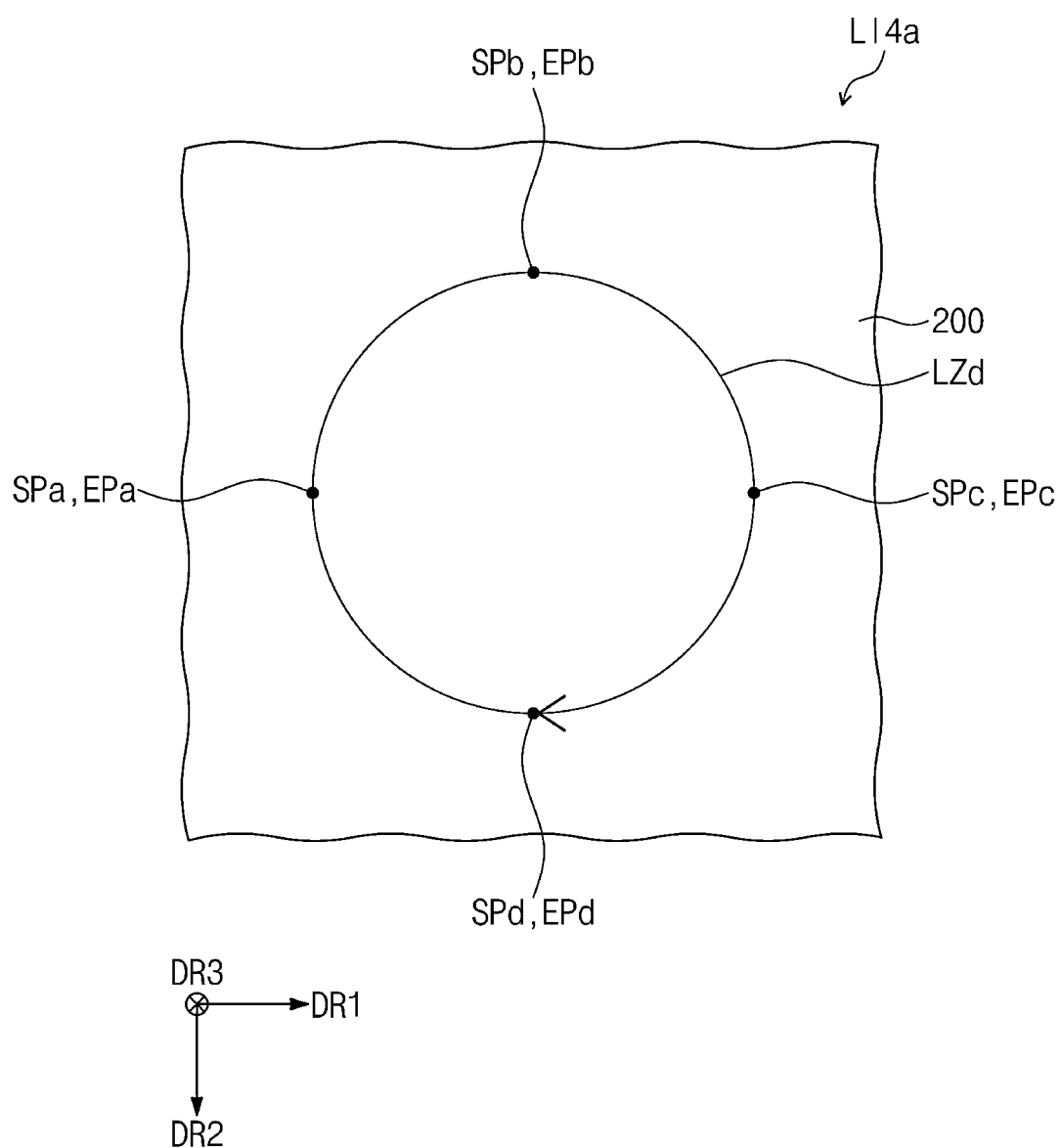
FIG. 8D is a view illustrating yet another part of the exemplary embodiment of a laser machining method according the inventive concepts.

FIG. 8A is a view illustrating a part of another exemplary embodiment of a laser machining method according to the inventive concepts. FIG. 8B is a view illustrating another part of the exemplary embodiment of a laser machining method according to the inventive concepts. FIG. 8C is a view illustrating still another part of the exemplary embodiment of a laser machining method according to the inventive concepts. FIG. 8D is a view illustrating yet another part of the exemplary embodiment of a laser machining method according to the inventive concepts.

In detail, FIG. 8A illustrates a path LZa of a laser beam irradiated in a first irradiation process LI1a, FIG. 8B illustrates a path LZb of a laser beam irradiated in a second irradiation process LI2a, FIG. 8C illustrates a path LZc of a laser beam irradiated in a third irradiation process LI3a, and FIG. 8D illustrates a path LZd of a laser beam irradiated in a fourth irradiation process LI4a. The first laser beam LZ1 described with reference to FIG. 4 and the second laser beam described with reference to FIG. 6 may be applied to the laser beam.

The first irradiation process LI1a, the second irradiation process LI2a, the third irradiation process LI3a and the fourth irradiation process LI4a may be sequentially repeated. According to an exemplary embodiment of the inventive concepts, first to fourth start points SPa, SPb, SPc and SPd of the first to fourth irradiation processes LI1a, LI2a, LI3a and LI4a may be different from each other. In addition, first to fourth end points EPa, EPb, EPc and EPd of the first to fourth irradiation processes LI1a, LI2a, LI3a and LI4a may be different from each other.

If the first to fourth start points SPa, SPb, SPc and SPd are the same as each other, a heat affected zone may be concentrated in a specific area. Thus, an area of the heat affected zone may be non-uniform. This may increase a defective rate of a product as compared with a case in which the heat affected zone is uniformly distributed. According to an exemplary embodiment of the inventive concepts, a position of an irradiation start point of the laser beam may be changed. For example, the second start point SPb may be spaced apart from the first start point SPa along the path of the laser beam by 90 degrees with respect to a center of the circular path of the laser beam. The third start point SPc may be spaced apart from the second start point SPb by 90 degrees along the path of the laser beam. The fourth start point SPd may be spaced apart from the third start point SPc by 90 degrees along the path of the laser beam. The position of the irradiation start point of the laser beam may be changed per irradiation process to prevent heat from being concentrated in a specific area, and thus the non-uniform phenomenon of the area of the heat affected zone may be reduced or minimized. As a result, a defective rate may be reduced, and thus reliability of a product may be improved.

In FIGS. 8A to 8D, the start points adjacent to each other are spaced apart from each other by an interval of 90 degrees with respect to the center of the circular path of the laser beam. However, the inventive concepts are not limited thereto. In other exemplary embodiments, the start points adjacent to each other may be spaced apart from each other by an interval of 180 degrees or may be spaced apart from each other by an interval of 30 degrees.

In addition, if the positions of the first to fourth start points are the same as each other, a portion corresponding to the position of the start points may not be completely cut. If the uncut portion is physically removed, the display module 200 may be damaged. However, according to the exemplary embodiment of the inventive concepts, the positions of the first to fourth start points SPa, SPb, SPc and SPd may be different from each other as illustrated in FIGS. 8A to 8D, and thus the probability of occurrence of an uncut portion may be reduced.

Figure 9:
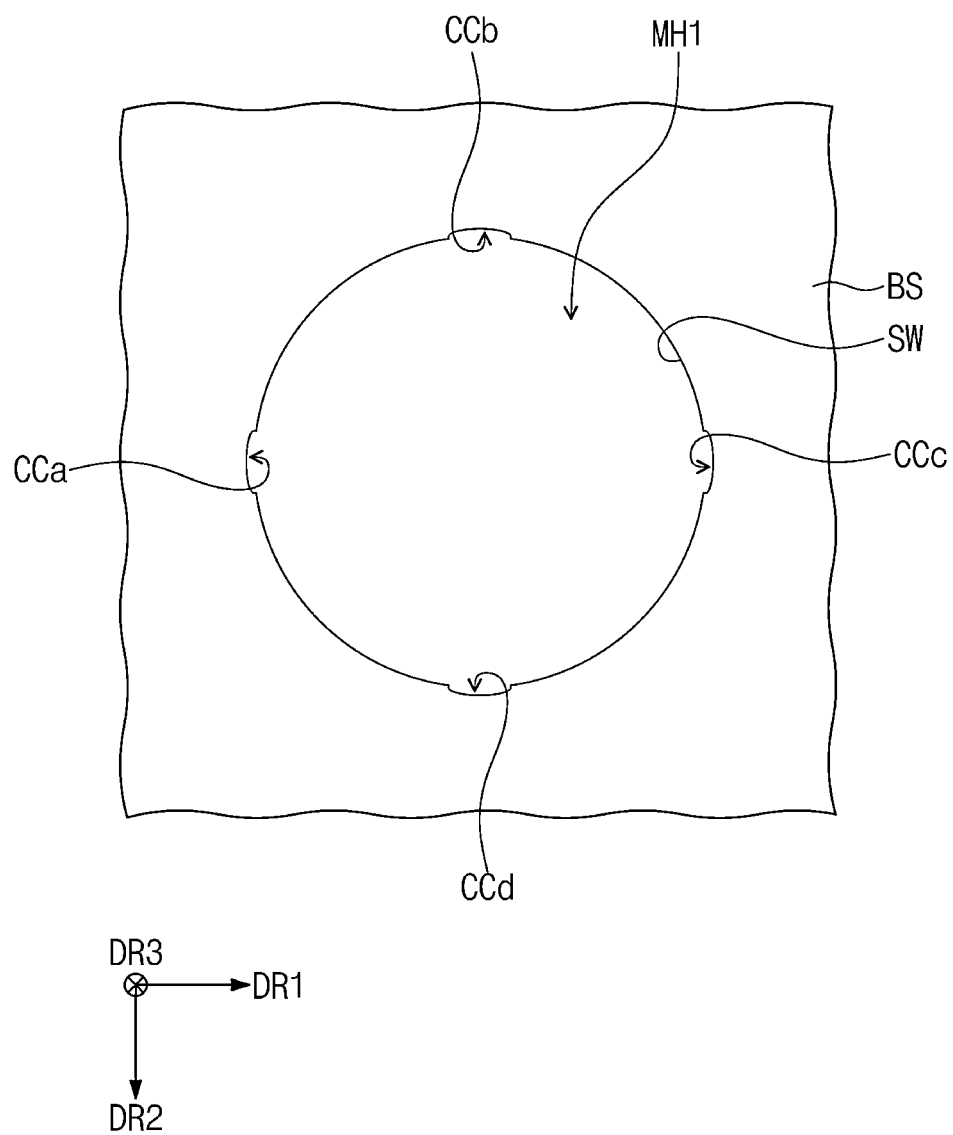
FIG. 9 is an enlarged, bottom plan view illustrating an exemplary embodiment of a portion of a display module according to the inventive concepts.

FIG. 9 is an enlarged, bottom plan view illustrating an exemplary embodiment of a portion of a display module according the inventive concepts.

FIG. 9 is a plan view illustrating a surface of the base layer BS, which is in contact with the circuit layer ML (see FIG. 2). A sidewall portion SW of the base layer BS may define the through-hole MH1. A first concave portion CCa, a second concave portion CCb, a third concave portion CCc and a fourth concave portion CCd may be defined in the sidewall portion SW.

The sidewall portion SW may be formed to correspond to the boundary BD (see FIG. 3) described above. The first to fourth concave portions CCa, CCb, CCc and CCd may be regions recessed from the sidewall portion SW.

The first concave portion CCa may be formed by the first irradiation process LI1a described above with reference to FIG. 8A, the second concave portion CCb may be formed by the second irradiation process LI2a described above with reference to FIG. 8B, the third concave portion CCc may be formed by the third irradiation process LI3a described above with reference to FIG. 8C, and the fourth concave portion CCd may be formed by the fourth irradiation process LI4a described above with reference to FIG. 8D.

A position of the first concave portion CCa may correspond to the position of the first start point SPa and the first end point EPa, a position of the second concave portion CCb may correspond to the position of the second start point SPb and the second end point EPb, a position of the third concave portion CCc may correspond to the position of the third start point SPc and the third end point EPc, and a position of the fourth concave portion CCd may correspond to the position of the fourth start point SPd and the fourth end point EPd. Portions of the sidewall portion SW which correspond to the positions of the start points and the end points above may be etched more than other portions of the sidewall portion SW. Thus, the concave portions CCa, CCb, CCc and CCd may be formed in areas corresponding to the positions of the start points and the end points.

Figure 10A:
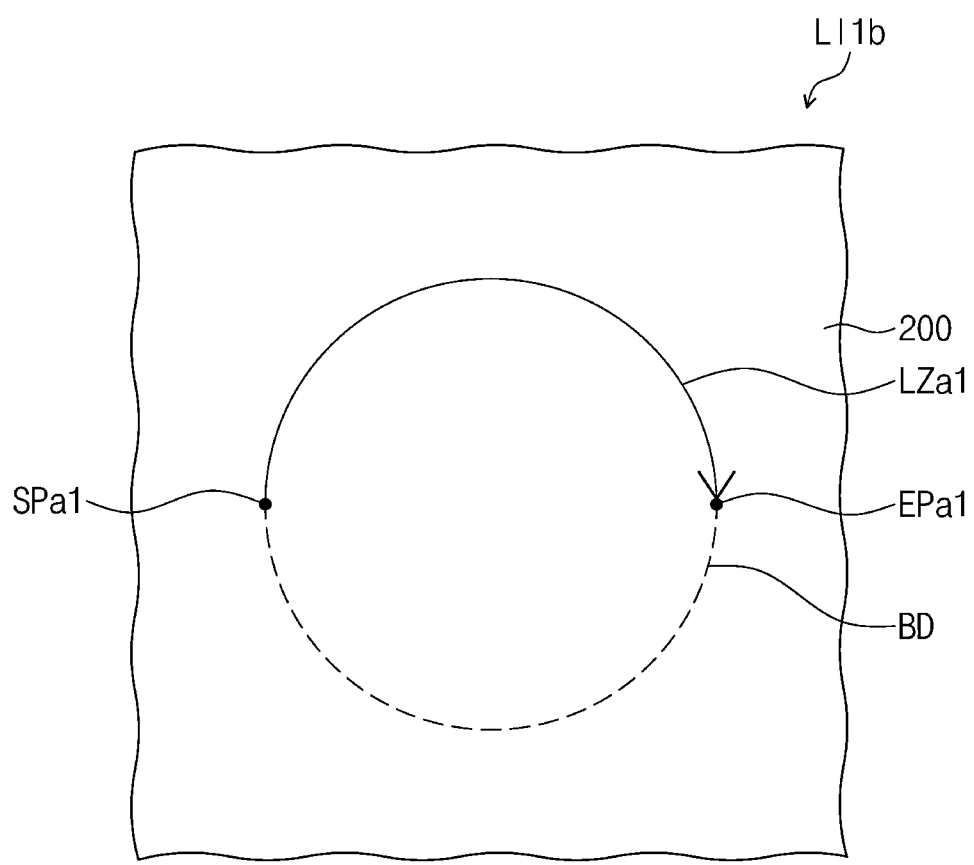
FIG. 10A is a view illustrating a part of still another exemplary embodiment of a laser machining method according to the inventive concepts.
Figure 10B:
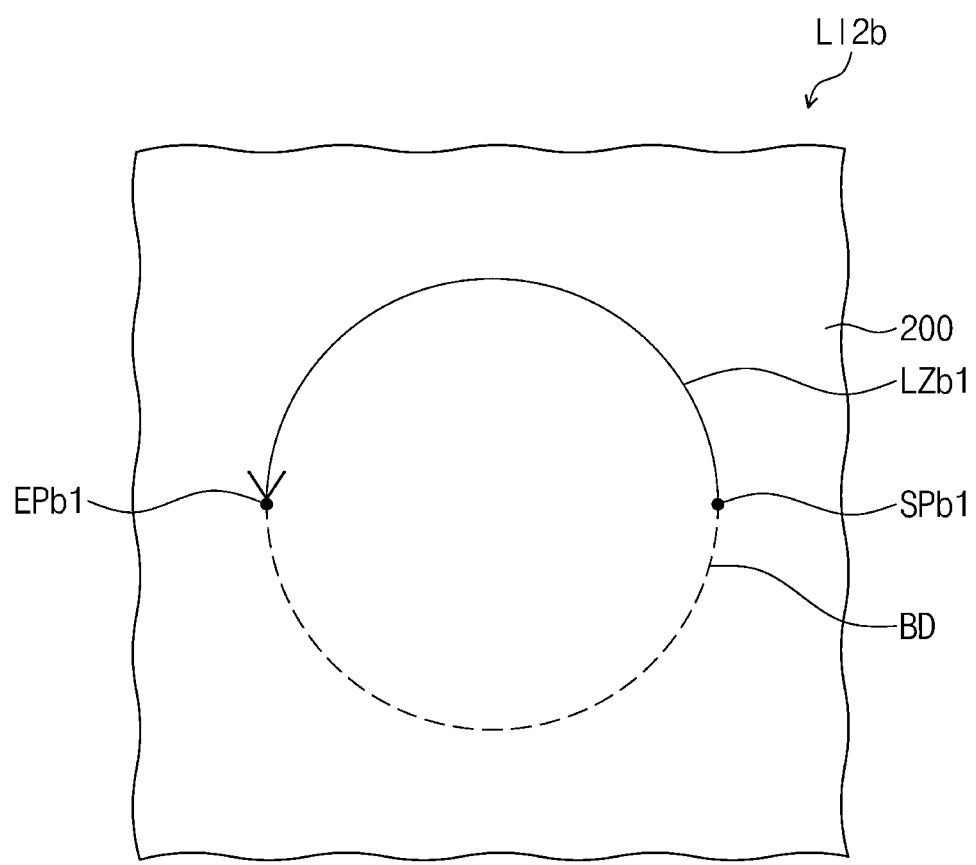
FIG. 10B is a view illustrating another part of the exemplary embodiment of a laser machining method according to the inventive concepts.
Figure 10C:
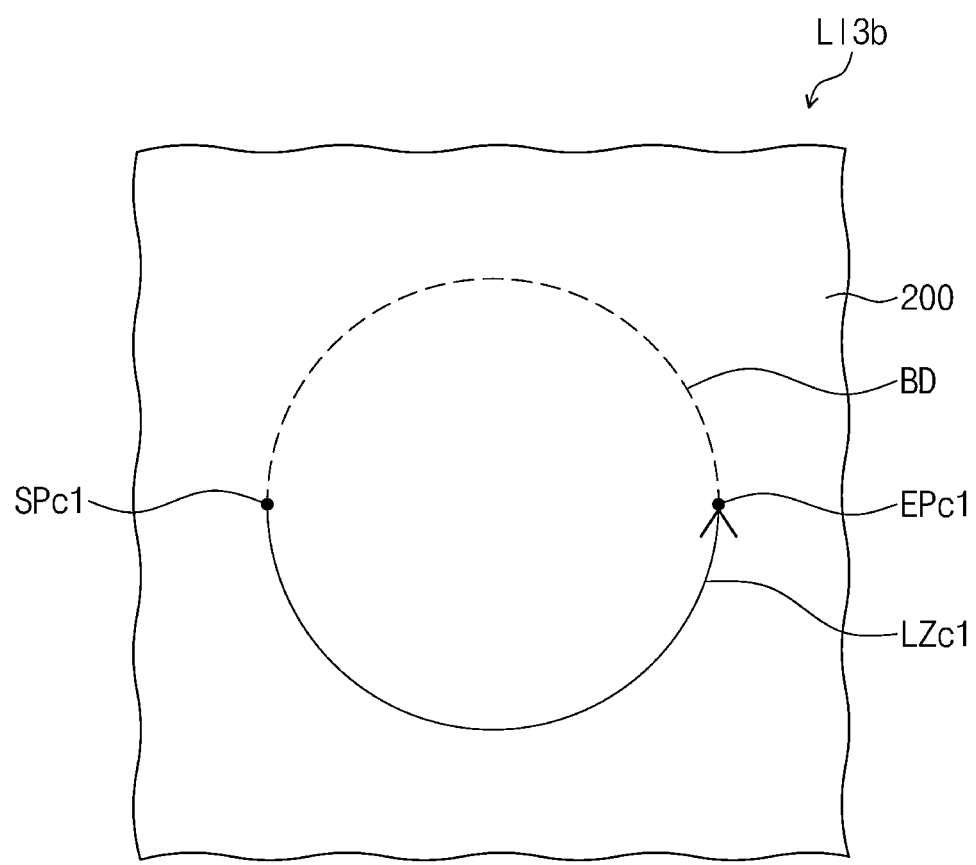
FIG. 10C is a view illustrating still another part of the exemplary embodiment of a laser machining method according to the inventive concepts.
Figure 10D:
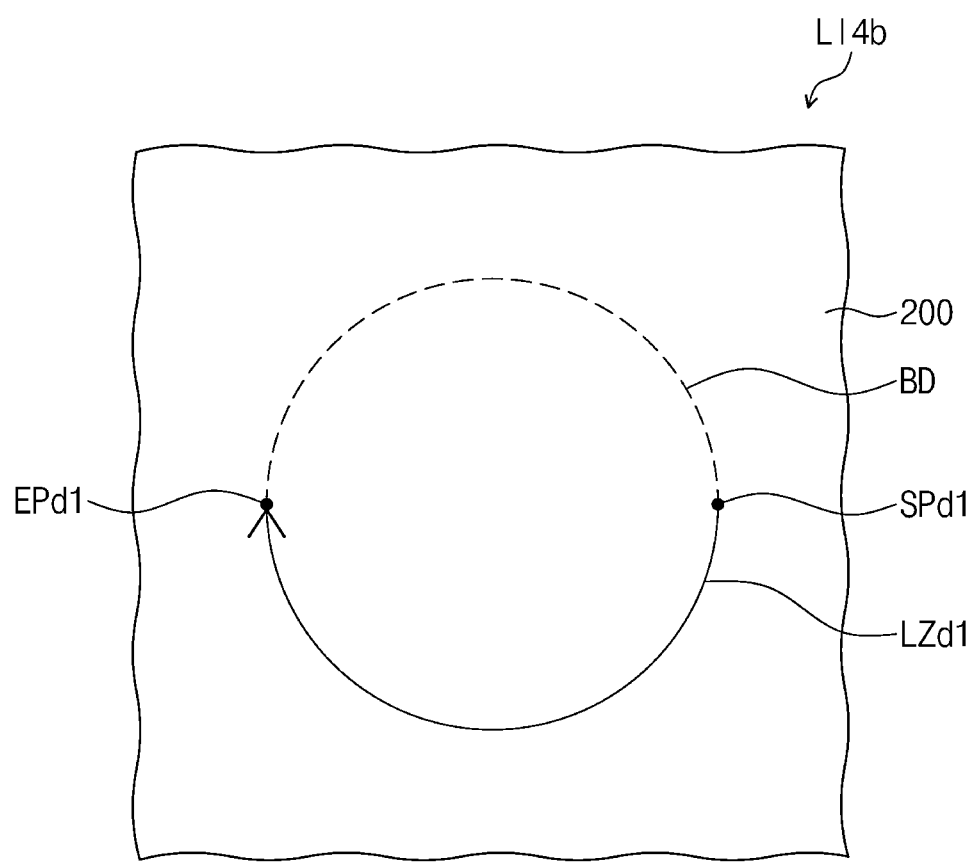
FIG. 10D is a view illustrating yet another part of the exemplary embodiment of a laser machining method according to the inventive concepts.

FIG. 10A is a view illustrating a part of still another exemplary embodiment of a laser machining method according to the inventive concepts. FIG. 10B is a view illustrating another part of the exemplary embodiment of a laser machining method according to the inventive concepts. FIG. 10C is a view illustrating still another part of the exemplary embodiment of a laser machining method according to the inventive concepts. FIG. 10D is a view illustrating yet another part of the exemplary embodiment of a laser machining method according to the inventive concepts.

In detail, FIG. 10A illustrates a path LZa1 of a laser beam irradiated in a first irradiation process LI1b, FIG. 10B illustrates a path LZb1 of a laser beam irradiated in a second irradiation process LI2b, FIG. 10C illustrates a path LZc1 of a laser beam irradiated in a third irradiation process LI3b, and FIG. 10D illustrates a path LZd1 of a laser beam irradiated in a fourth irradiation process LI4b. The first irradiation process LI1b, the second irradiation process LI2b, the third irradiation process LI3b and the fourth irradiation process LI4b may be sequentially repeated.

In each of the first to fourth irradiation processes LI1b, LI2b, LI3b and LI4b, the laser beam may be irradiated to only a portion of the boundary BD. For example, when the boundary BD has a circular shape, the laser beam may be irradiated to an area corresponding to a semicircle in each of the first to fourth irradiation processes LI1b, LI2b, LI3b and LI4b.

In the first irradiation process LI1b, a first end point EPa1 may be spaced apart from a first start point SPa1 by 180 degrees with respect to the center of the circular path along the path of the laser beam. In the second irradiation process LI2b, a second start point SPb1 may be the same as the first end point EPa1. In the second irradiation process LI2b, a second end point EPb1 may be the same as the first start point SPa1.

In an exemplary embodiment, a movement direction of the laser beam irradiated in the first irradiation process LI1b may be different from a movement direction of the laser beam irradiated in the second irradiation process LI2b. For example, the movement direction of the laser beam irradiated in the first irradiation process LI1b may be a clockwise direction, and the movement direction of the laser beam irradiated in the second irradiation process LI2b may be a counterclockwise direction. Thus, the laser beam may be irradiated to the same portion of the boundary BD in the first and second irradiation processes LI1b and LI2b.

In the third and fourth irradiation processes LI3b and LI4b, the laser beam may be irradiated to a remaining portion of the boundary BD. A third start point SPc1 of the path LZc1 of the laser beam in the third irradiation process LI3b may be the same as the first start point SPa1. A third end point EPc1 of the path LZc1 of the laser beam in the third irradiation process LI3b may be the same as the first end point EPa1. However, the movement direction of the laser beam irradiated in the first irradiation process LI1b may be the clockwise direction, and a movement direction of the laser beam irradiated in the third irradiation process LI3b may be the counterclockwise direction. Thus, the laser beams of the first and third irradiation processes LI1b and LI3b may be irradiated to different areas. Two concave portions (e.g., the first start point SPa1 and the first end point EPa1) may be defined in a sidewall portion of a through-hole MH1 (see FIG. 1B) formed by the laser machining method illustrated in FIGS. 10A to 10D.

FIGS. 11A to 11D are views illustrating yet another exemplary embodiment of a laser machining method according to the inventive concepts.

Figure 11A:
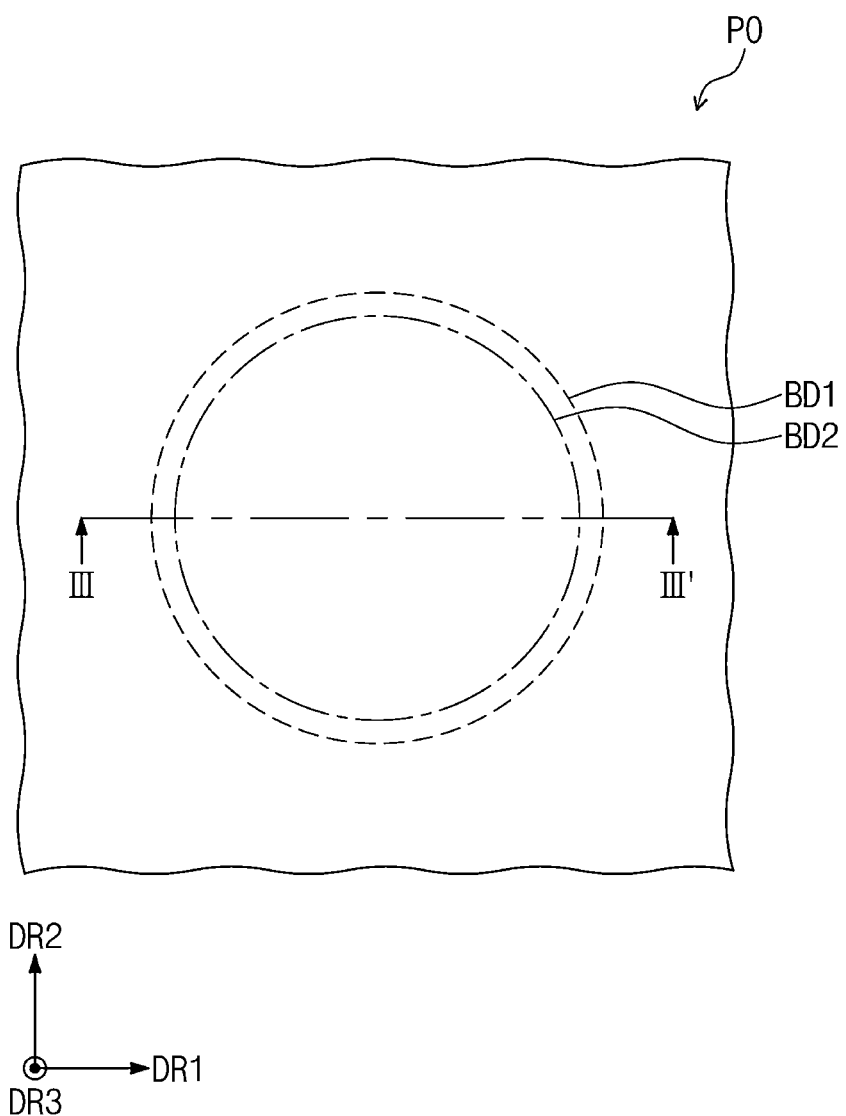
FIGS. 11A to 11D are views illustrating yet another exemplary embodiment of a laser machining method according to the inventive concepts.
Figure 11B:
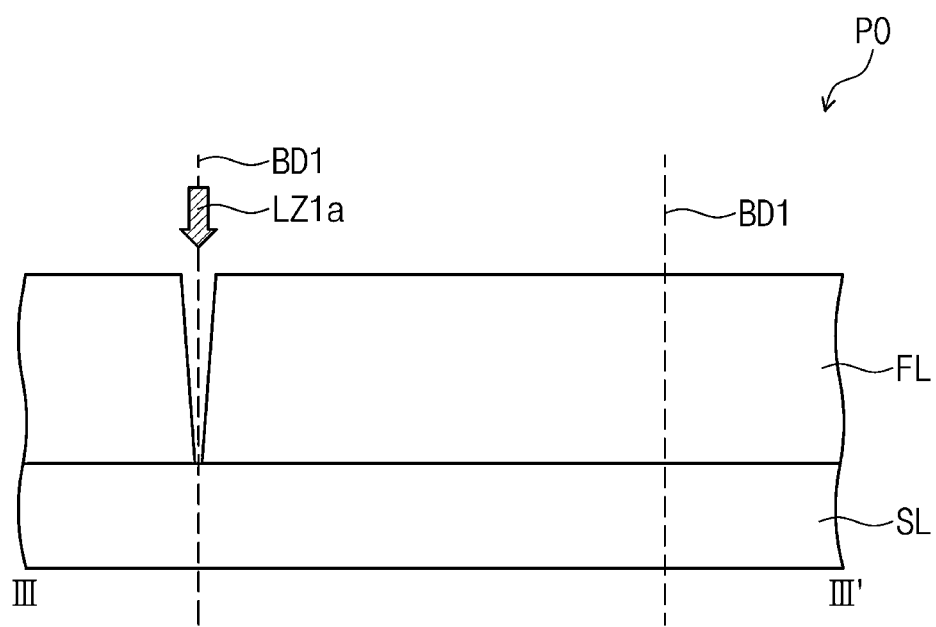

Referring to FIGS. 11A and 11B, a processing object PO (i.e., object to be processed) may include a first layer FL and a second layer SL. A thermal deformation temperature of the first layer FL may be lower than a thermal deformation temperature of the second layer SL. In this case, at the same temperature, the probability that the first layer FL will be deformed may be higher than the probability that the second layer SL will be deformed.

Referring to FIG. 11B, a first laser beam LZ1a may be irradiated to the first layer FL along a first boundary BD1. This is referred to as a first irradiation process.

Figure 11C:
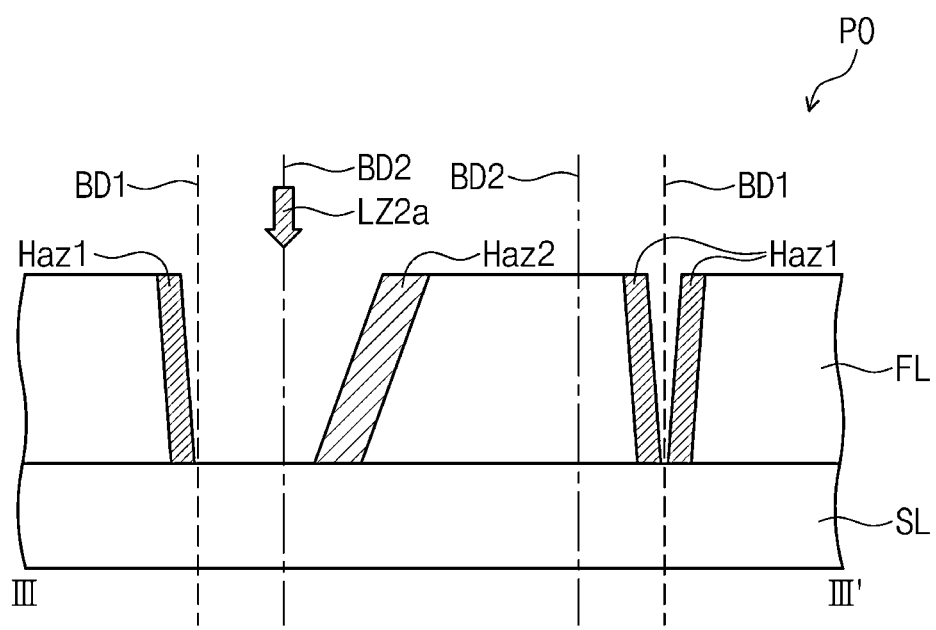

Referring to FIG. 11C, a second laser beam LZ2a may be irradiated to the first layer FL along a second boundary BD2. This is referred to as a second irradiation process. Power of the second laser beam LZ2a may be stronger than power of the first laser beam LZ1a. An irradiation speed of the first laser beam LZ1a in the first irradiation process may be faster than an irradiation speed of the second laser beam LZ2a in the second irradiation process.

FIG. 11C illustrates a first heat affected zone Haz1 generated by the first laser beam LZ1a and a second heat affected zone Haz2 generated by the second laser beam LZ2a. An area of the second heat affected zone Haz2 may be greater than an area of the first heat affected zone Haz1. According to an exemplary embodiment of the inventive concepts, the first boundary BD1 may surround the second boundary BD2. The second boundary BD2 may be closer to an area removed from the processing object PO than the first boundary BD1. Thus, the second heat affected zone Haz2 having the relatively great area may be removed from the processing object PO.

The first laser beam LZ1a and the second laser beam LZ2a described with reference to FIGS. 11A to 11C may be irradiated to the anti-reflection layer RPL (see FIG. 6). For example, the third irradiation process LI3 illustrated in FIG. 7A may correspond to the process described with reference to FIG. 11B, and the fourth irradiation process LI4 illustrated in FIG. 7B may correspond to the process described with reference to FIG. 11C. However, according to FIGS. 11B and 11C, a path of the second laser beam LZ2 in the third irradiation process LI3 may correspond to the first boundary BD1, and a path of the second laser beam LZ2 in the fourth irradiation process LI4 may correspond to the second boundary BD2. In this case, the first boundary BD1 may be referred to as a second boundary, and the second boundary BD2 may be referred to as a third boundary.

Figure 11D:
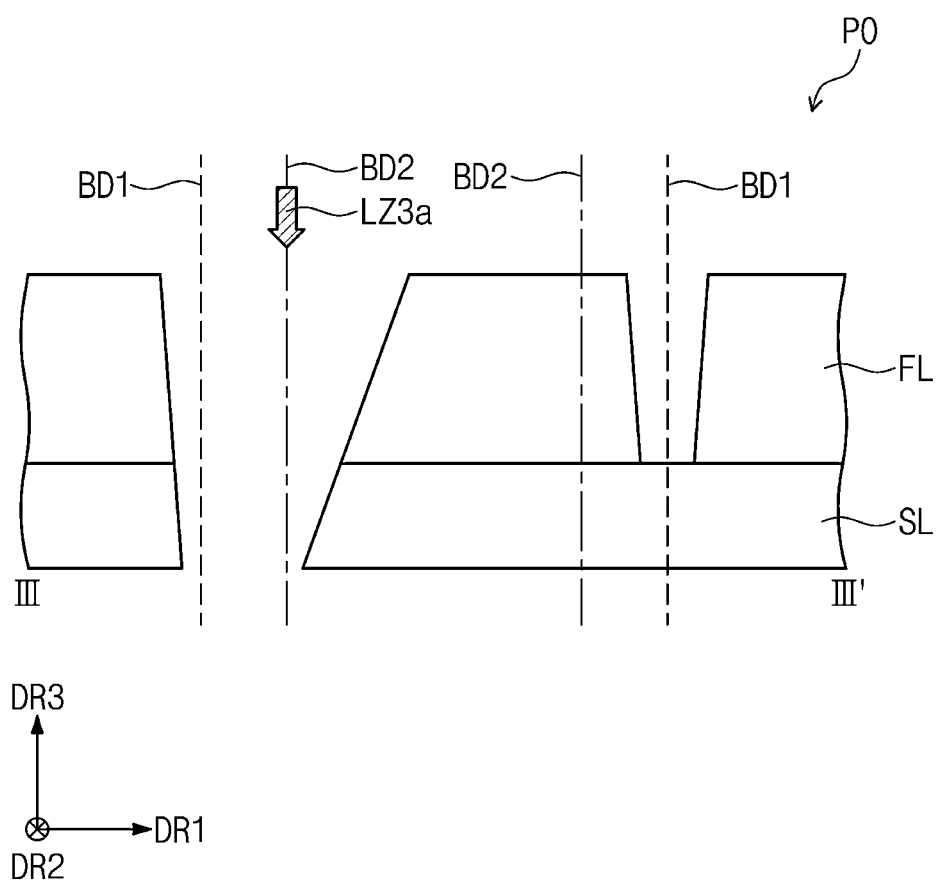

Referring to FIG. 11D, a third laser beam LZ3a may be irradiated to the second layer SL along the second boundary BD2. This is referred to as a third irradiation process. Power of the third laser beam LZ3a may be equal to the power of the second laser beam LZ2a. However, the inventive concepts are not limited thereto. In addition, an irradiation speed of the third laser beam LZ3a in the third irradiation process may be equal to the irradiation speed of the second laser beam LZ2a in the second irradiation process. However, the inventive concepts are not limited thereto.

In an exemplary embodiment, a time interval between the first irradiation process and the second irradiation process may be greater than a time interval between the second irradiation process and the third irradiation process. Thus, a time in which heat provided in the first layer FL is diffused may be secured.

In an exemplary embodiment, the third irradiation process may be performed a plurality of times. In this case, a first time interval between the third irradiation processes may be 0 second or more. For example, when the first time interval is 0 second, the third irradiation processes may be continuously performed. In addition, a second time interval between the first irradiation process and the second irradiation process may be greater than the first time interval. In an exemplary embodiment, the second irradiation process may be performed a plurality of times. In this case, a time interval between the second irradiation processes may be greater than the first time interval.

According to some exemplary embodiments of the inventive concepts, a time in which heat provided to the processing object is diffused may be secured by adjusting the time intervals between the first to third irradiation processes. As a result, it is possible to prevent the area of the heat affected zone from increasing, and thus occurrence of defects may be minimized and reliability of the product may be improved.

According to some exemplary embodiments of the inventive concepts, the time interval may be provided between the irradiation processes of the laser beam to secure a time in which heat provided in the processing object is diffused. As a result, it is possible to prevent the area of the heat affected zone from increasing, and thus occurrence of defects may be minimized. In addition, a position of the irradiation start point of the laser beam may be changed. The position of the irradiation start point of the laser beam may be changed to prevent heat from being concentrated in a specific area, and thus the non-uniform phenomenon of the area of the heat affected zone may be reduced or minimized. That is, the phenomenon that the heat affected zone is not uniformly distributed may be reduced.

While the inventive concepts have been described with reference to exemplary embodiments, it will be apparent to those skilled in the art that various changes and modifications may be made without departing from the spirits and scopes of the inventive concepts. Therefore, it should be understood that the above exemplary embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A display module comprising:
a base layer which defines a through-hole;
a circuit layer disposed on the base layer;
an emission layer disposed on the circuit layer;
an encapsulation layer disposed on the emission layer; and
an anti-reflection layer disposed on the encapsulation layer,
wherein two or more concave portions are defined in a sidewall portion defining the through-hole.

* * * * *